United States Patent
Ito

(10) Patent No.: US 10,446,230 B2
(45) Date of Patent: Oct. 15, 2019

(54) MEMORY DEVICE

(71) Applicant: TOSHIBA MEMORY CORPORATION, Minato-ku, Tokyo (JP)

(72) Inventor: Yuichi Ito, Yokkaichi Mie (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/914,870

(22) Filed: Mar. 7, 2018

(65) Prior Publication Data

US 2019/0088327 A1    Mar. 21, 2019

(30) Foreign Application Priority Data

Sep. 19, 2017 (JP) ................. 2017-178841

(51) Int. Cl.
| | |
|---|---|
| *G11C 13/00* | (2006.01) |
| *G11C 11/16* | (2006.01) |
| *H01L 43/08* | (2006.01) |
| *H01L 27/24* | (2006.01) |

(Continued)

(52) U.S. Cl.
CPC ........ *G11C 13/0069* (2013.01); *G11C 11/161* (2013.01); *G11C 11/1655* (2013.01); *G11C 11/1657* (2013.01); *G11C 11/1659* (2013.01); *G11C 11/1673* (2013.01); *G11C 11/1675* (2013.01); *H01L 27/228* (2013.01); *H01L 27/2409* (2013.01); *H01L 27/2454* (2013.01); *H01L 27/2481* (2013.01); *H01L 43/08* (2013.01); *H01L 43/12* (2013.01)

(58) Field of Classification Search
CPC .................................................. G11C 13/0069
USPC ......................................................... 365/148
See application file for complete search history.

(56) References Cited

U.S. PATENT DOCUMENTS

| | | | |
|---|---|---|---|
| 2007/0279963 A1 | 12/2007 | Tsuchida et al. | |
| 2010/0321980 A1* | 12/2010 | Fujita ................. | G11C 13/0004 365/148 |
| 2014/0042567 A1 | 2/2014 | Jung et al. | |

(Continued)

FOREIGN PATENT DOCUMENTS

| | | |
|---|---|---|
| JP | 2007317795 A | 12/2007 |
| JP | 2016015368 A | 1/2016 |

OTHER PUBLICATIONS

U.S. Appl. No. 15/691,469, Title: "Magnetic Memory Device," filed Aug. 30, 2017, First Named Inventor: Yuichi Ito.

(Continued)

*Primary Examiner* — Jason Lappas
(74) *Attorney, Agent, or Firm* — Holtz, Holtz & Volek PC

(57) ABSTRACT

A memory device includes first and second resistance change elements and first and second double-gate transistors. The first resistance change element includes first and second terminals. The second resistance change element includes a third terminal coupled to the first terminal and a fourth terminal. The first double-gate transistor includes a fifth terminal coupled to the second terminal, a sixth terminal, and a first gate coupled to a first word line and a second gate coupled to a second word line. The second double-gate transistor includes a seventh terminal coupled to the fourth terminal, an eighth element, and a third gate coupled to the first word line and a fourth gate coupled to a third word line.

2 Claims, 27 Drawing Sheets

(51) Int. Cl.
*H01L 43/12* (2006.01)
*H01L 27/22* (2006.01)

(56) References Cited

U.S. PATENT DOCUMENTS

2015/0255717 A1 9/2015 Park et al.
2017/0092355 A1 3/2017 Kurotsuchi et al.

OTHER PUBLICATIONS

K. Kurotsuchi, et al., "2.8-GB/s-write and 670-MB/s-erase operations of a 3D vertical chain-cell-type phase-change-memory array," 2015 Symposium on VLSI Technology Digest of Technical Papers, Jun. 16-18, 2015.

* cited by examiner

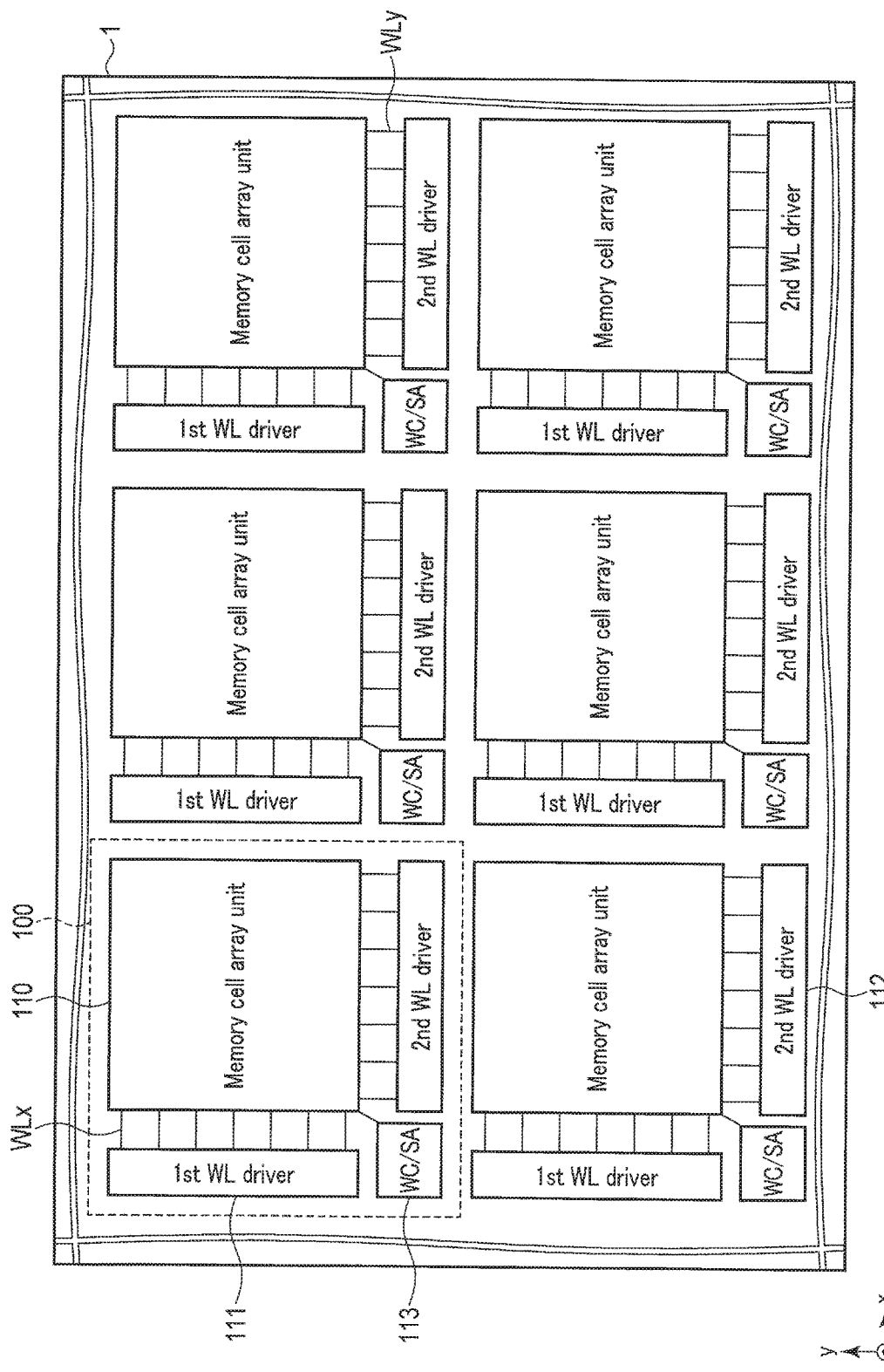
F I G. 1

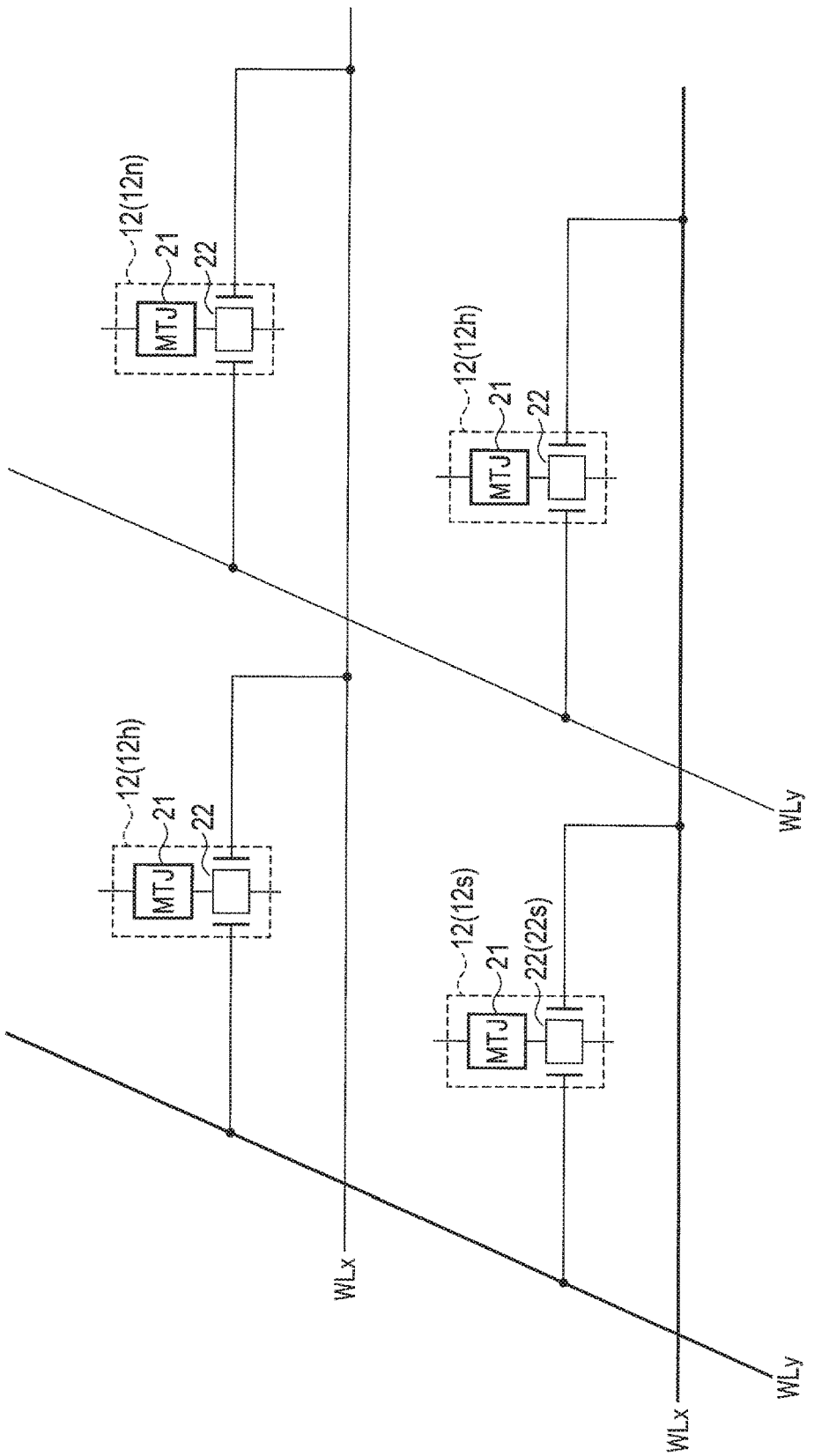
F I G. 6

F.I.G. 7

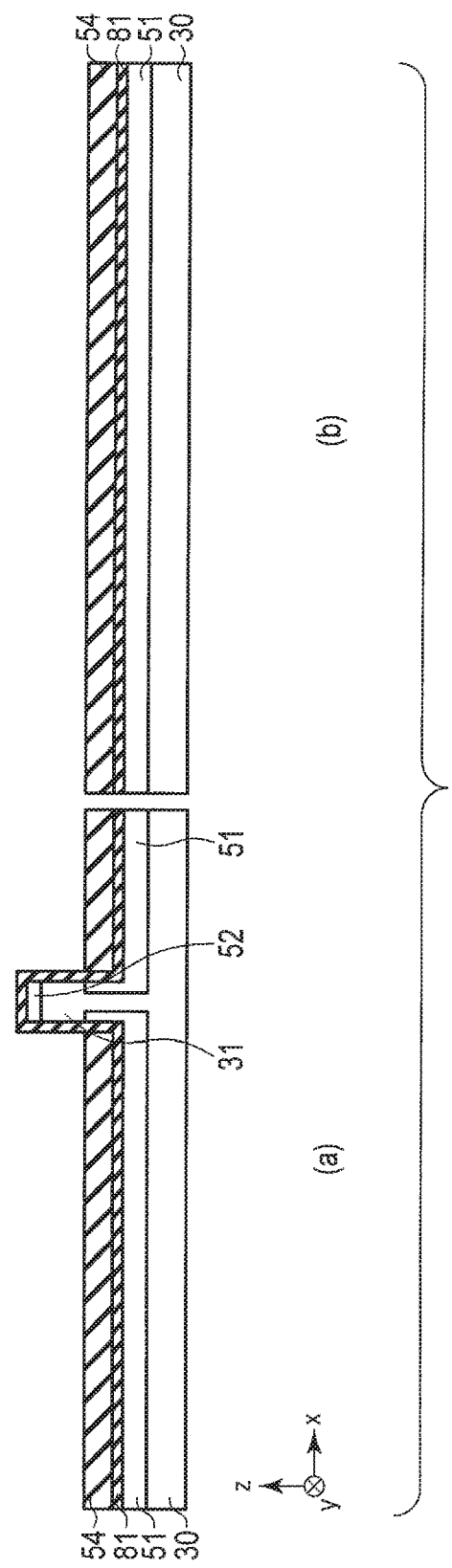
F I G. 15

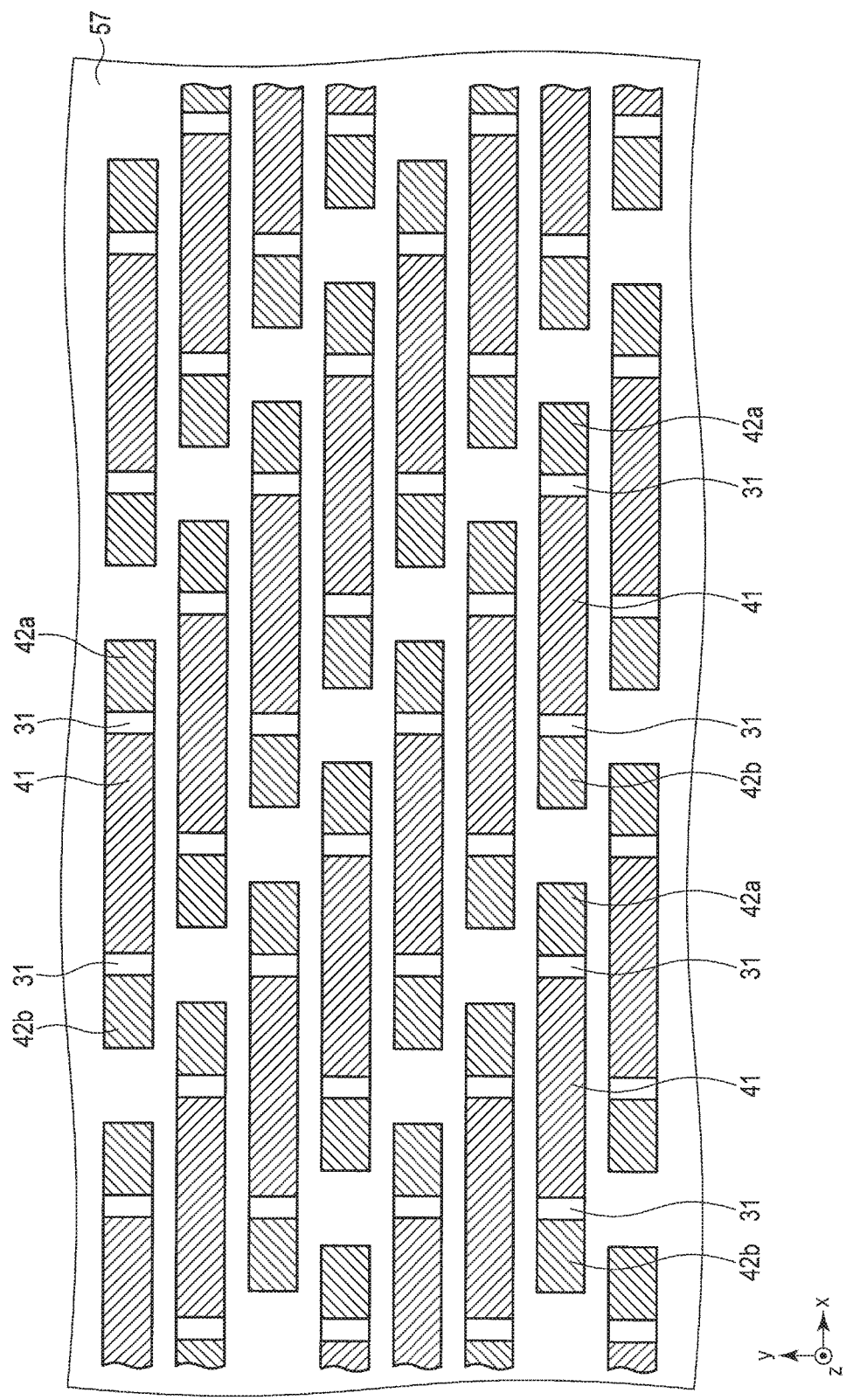
F I G. 18

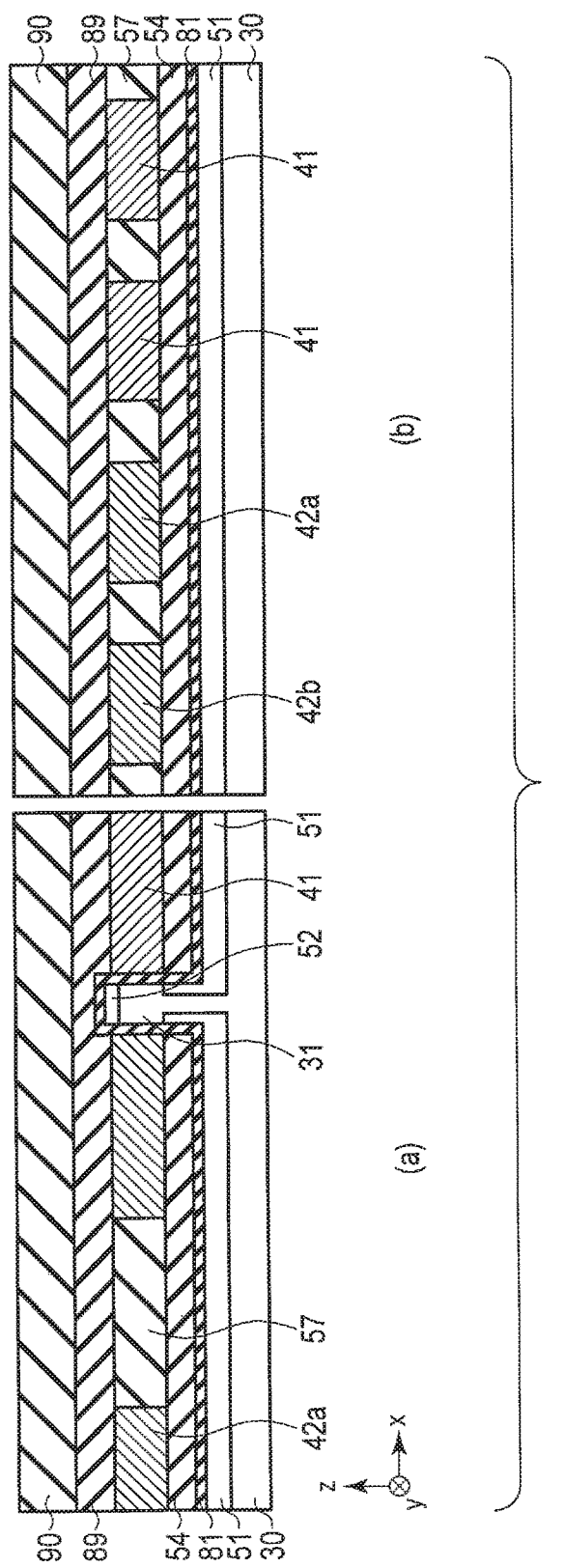
F I G. 20

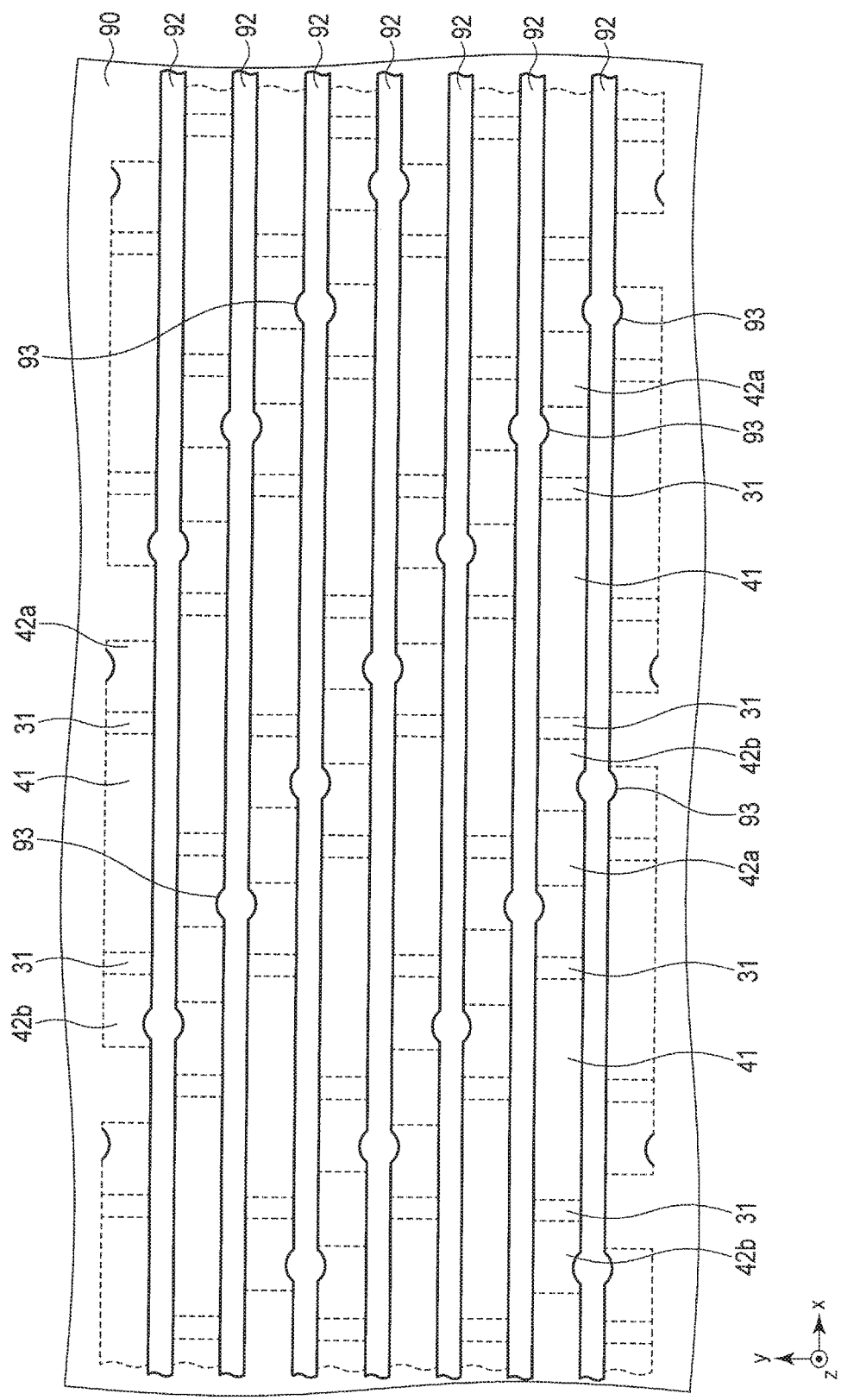
F I G. 21

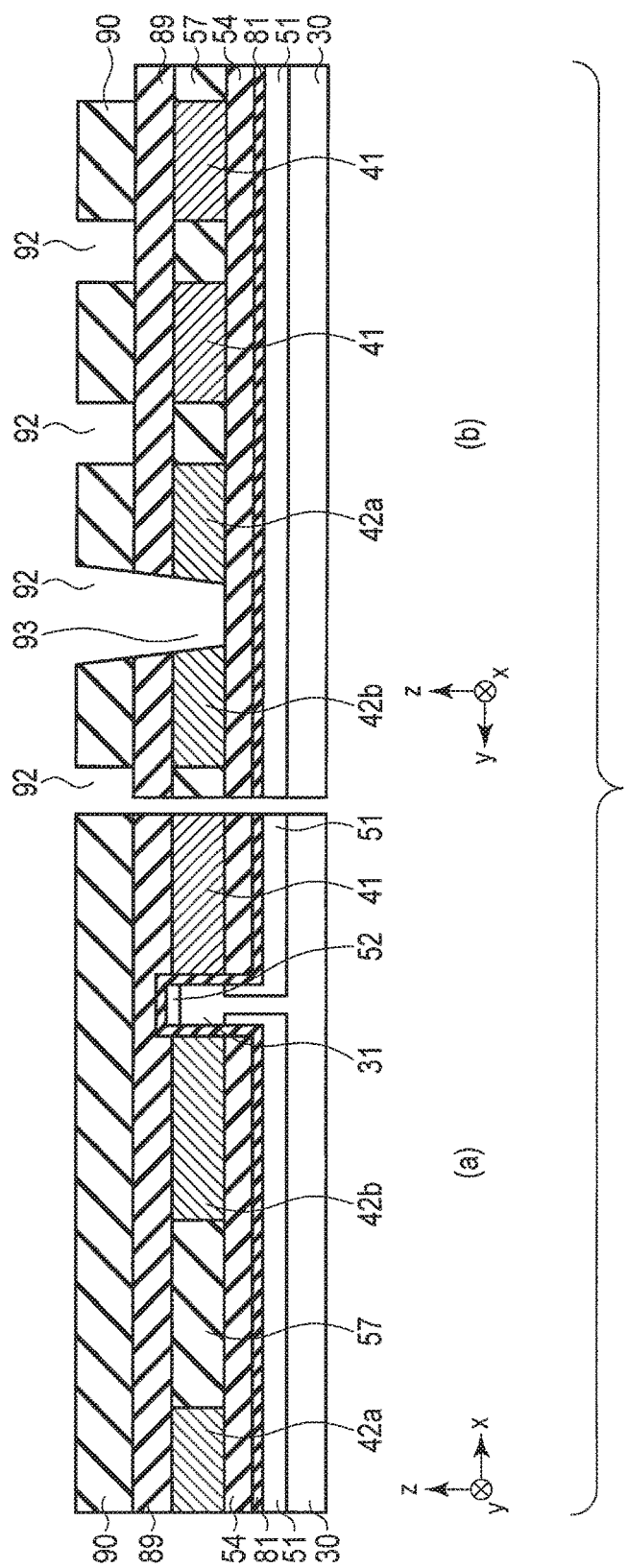
F I G. 22

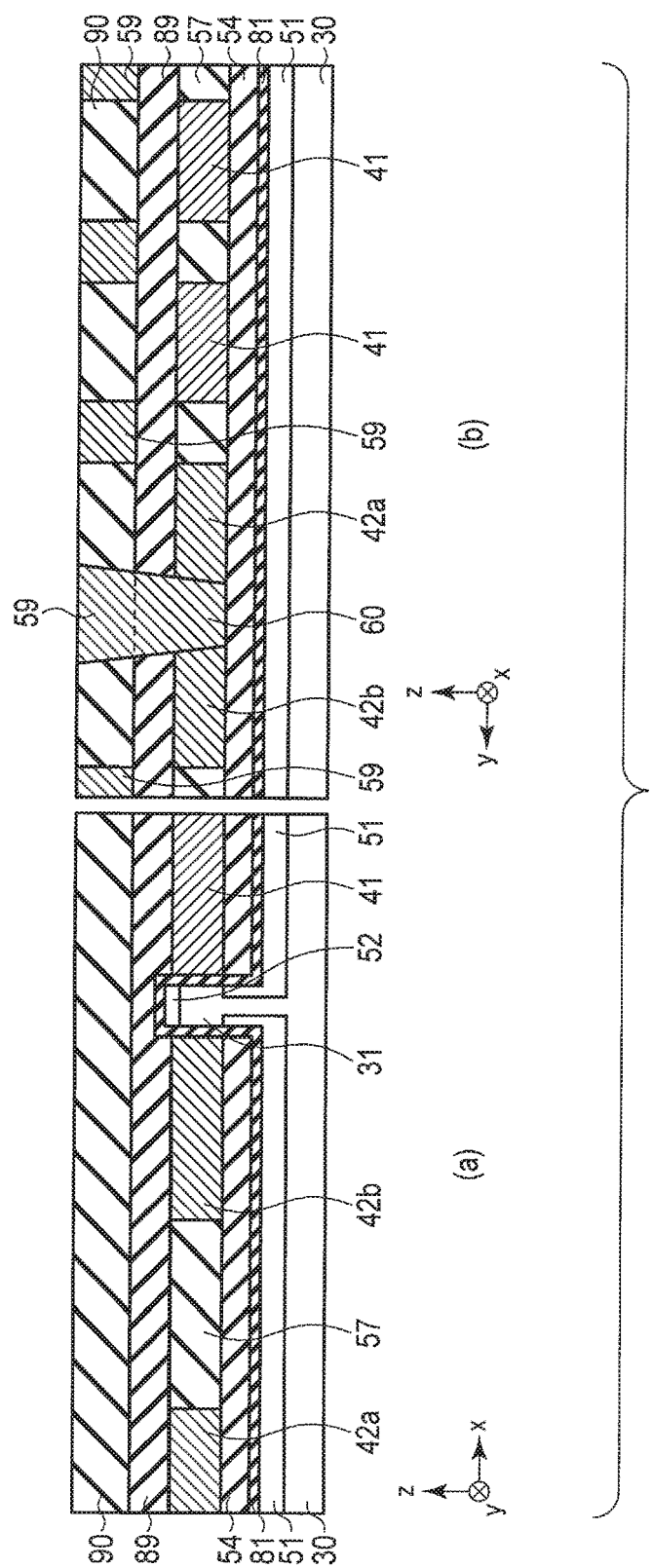
F I G. 23

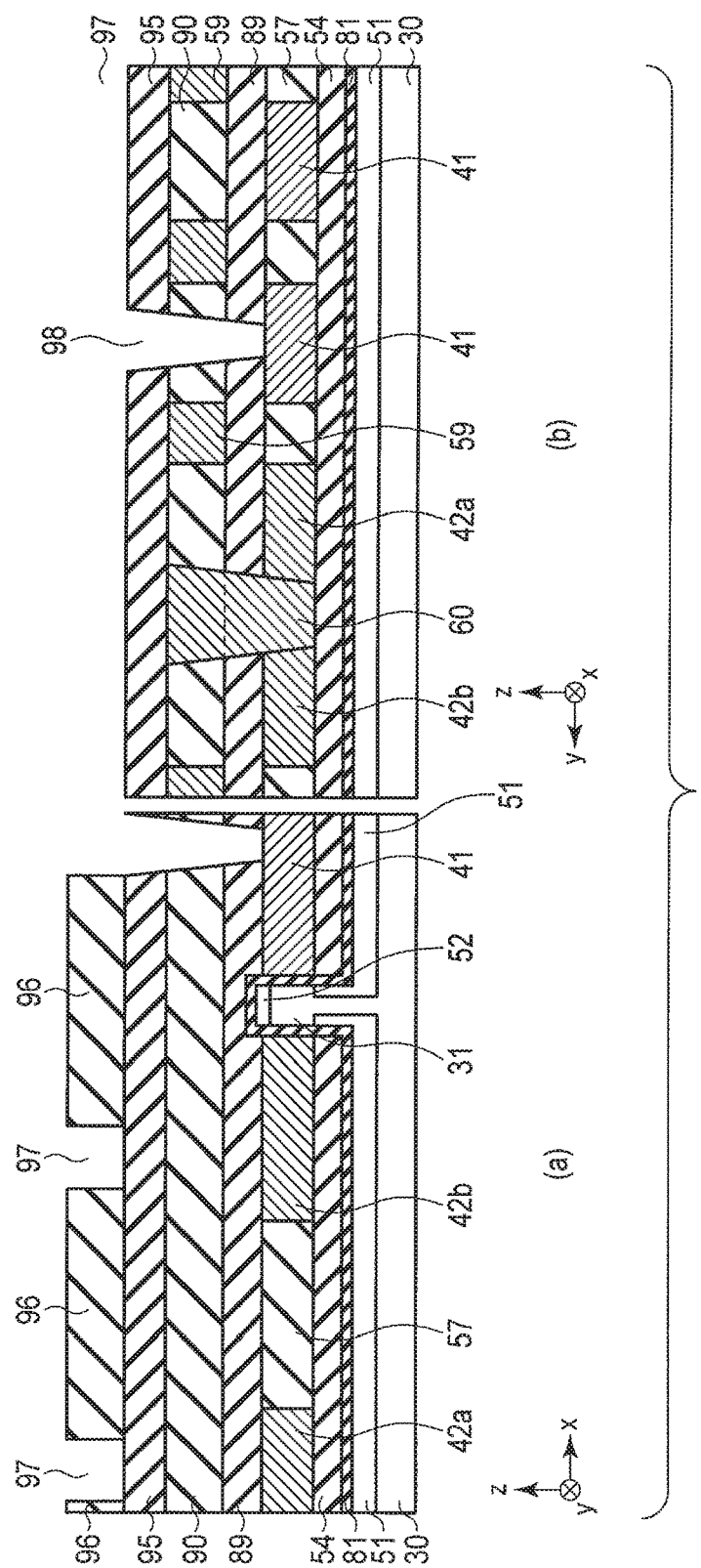
F I G. 26

MEMORY DEVICE

CROSS-REFERENCE TO RELATED APPLICATIONS

This application is based upon and claims the benefit of priority from Japanese Patent Application No. 2017-178841, filed Sep. 19, 2017, the entire contents of which are incorporated herein by reference.

FIELD

Embodiments described herein relate generally to a memory device.

BACKGROUND

A memory device that stores data using a magnetoresistive effect is known.

BRIEF DESCRIPTION OF THE DRAWINGS

FIG. 1 shows a layout example of components of a magnetoresistive memory device according to an embodiment;

FIG. 6 shows a state of part of the memory cell array unit during an operation according to the embodiment;

FIG. 15 shows a cross-sectional structure of the magnetoresistive memory device during the manufacturing process subsequent to FIG. 14 according to the embodiment;

FIG. 18 shows a planar structure of the magnetoresistive memory device during the manufacturing process subsequent to FIG. 17 according to the embodiment;

FIG. 20 shows a cross-sectional structure of the magnetoresistive memory device during the manufacturing process subsequent to FIG. 19 according to the embodiment;

FIG. 21 shows a planar structure of the magnetoresistive memory device during the manufacturing process subsequent to FIG. 20 according to the embodiment;

FIG. 22 shows a cross-sectional structure of the magnetoresistive memory device during the manufacturing process subsequent to FIG. 20 according to the embodiment;

FIG. 23 shows a cross-sectional structure of the magnetoresistive memory device during the manufacturing process subsequent to FIG. 22 according to the embodiment;

FIG. 26 shows cross-sectional structure of the magnetoresistive memory device during the manufacturing process subsequent to FIG. 24 according to the embodiment;

DETAILED DESCRIPTION

Figure 2:
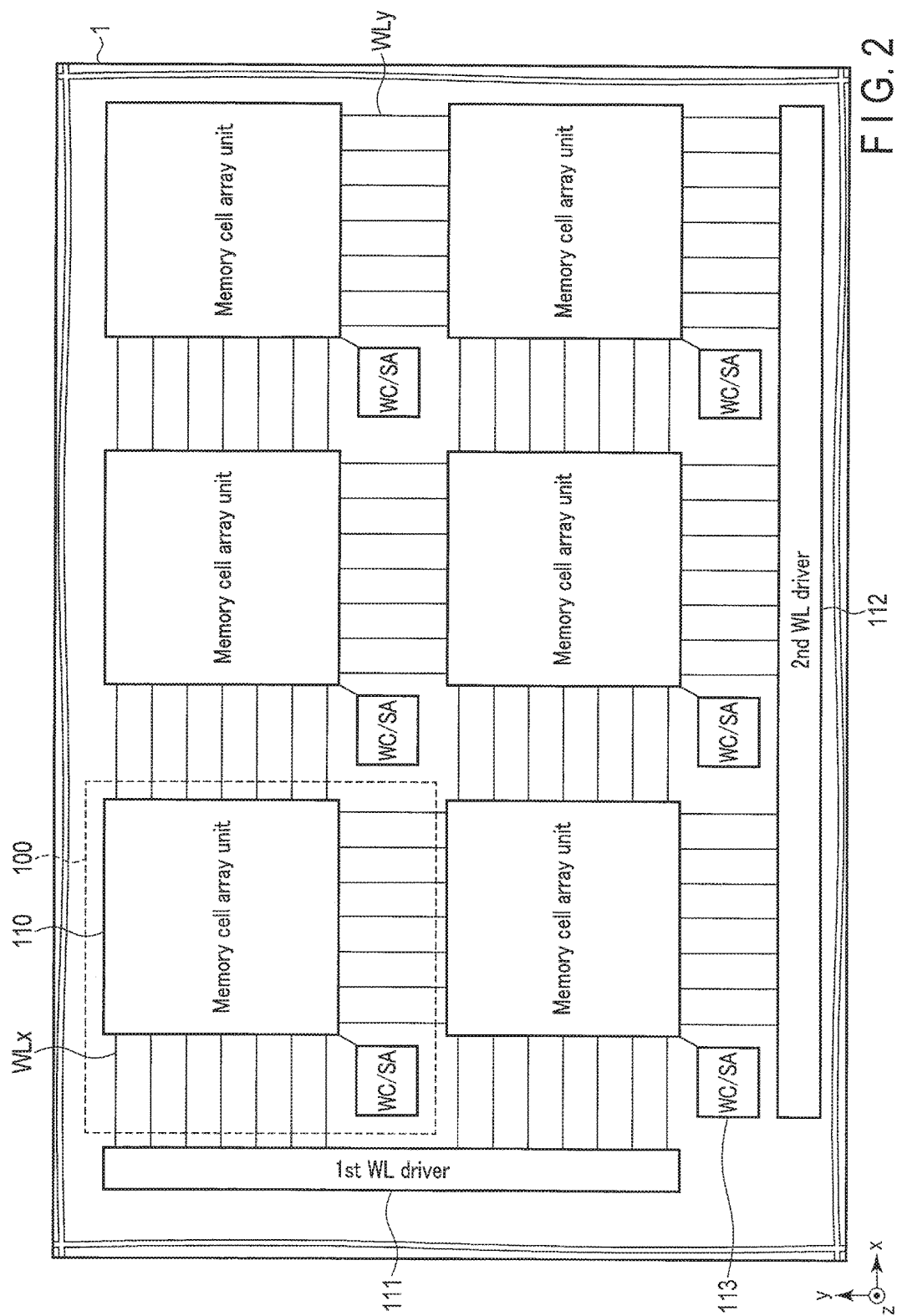
FIG. 2 shows another layout example of elements of the magnetoresistive memory device according to the embodiment.

In general, according to one embodiment, a memory device includes: a first resistance change element; a second resistance change element; a first double-gate transistor; and a second double-gate transistor. The first resistance change element includes a first terminal and a second terminal and has one of two different switchable resistances. The second resistance change element includes a third terminal coupled to the first terminal of the first resistance change element, includes a fourth terminal, and has one of two different switchable resistances. The first double-gate transistor includes a fifth terminal coupled to the second terminal of the first resistance change element, includes a sixth terminal, and includes a first gate coupled to a first word line and a second gate coupled to a second word line independent from the first word line. The second double-gate transistor includes a seventh terminal coupled to the fourth terminal of the second resistance change element, includes an eighth element, and includes a third gate coupled to the first word line and a fourth gate coupled to a third word line independent from the first and second word lines.

Embodiments will now be described with reference to the figures. In the following description, components with substantially the same functionalities and configurations will be referred to with the same reference numerals, and repeated descriptions may be omitted. The figures are schematic, and the relations between the thickness and the area of a plane of e layer and ratios of thicknesses of layers may differ from actual ones. Therefore, specific thickness and size should be determined in consideration of the following description. Moreover, the figures may include components which differ in relations and/or ratios of dimensions in different figures.

In the specification and the claims, a phrase of a particular first component being "coupled" to another second component includes the first component being coupled to the second component either directly or via one or more components which are always or selectively conductive.

Reference numerals that end with alphabetical characters are used to distinguish between similar elements. Descriptions about elements without such alphabetical suffixes are applicable to elements with alphabetical suffixes. When elements with alphabetical suffixes do not need to be distinguished from one another, such elements are indicated without the alphabetical suffixes FIG. 1 shows a layout example of components of a magnetic or magnetoresistive random access memory (MRAM) 1 according to the embodiment, and shows a structure of part of the magnetoresistive memory device 1 along the xy plane. As shown in FIG. 1, the magnetoresistive memory device 1 includes unit structures 100. Each of the unit structures 100 has the same structure, components, and connection.

Each unit structure 100 includes one memory cell array unit 110, a first word line driver 111, a second word line driver 112, and a writing circuit/sense amplifier (WC/SA) 113. The memory cell array unit 110 includes a bit plate 11 (not shown in FIG. 1), memory cells 12 (not shown in FIG. 1), word lines WLx, word lines WLy, and a source plate (not shown in FIG. 1). The word lines WLx and WLy are located below the bit plate 11 along the z axis, and portions of the word lines WLx and WLy located in the memory cell array unit 110 are not shown in FIG. 1.

The bit plate 11 extends along the xy plane over, for example, the entire memory cell array unit 110.

On the outer side of the corresponding memory cell array unit 110, the word lines WLx extend in a first direction, for example, along the x axis, and are arranged along one side (e.g., the left side) of the memory cell array unit 110.

On the outer side of the corresponding memory cell array unit 110, the word lines WLy extend in a second direction, for example, along the y axis, and are arranged along one side (e.g., the lower side) of the memory cell array unit 110.

The first word line driver 111 extends along one side (e.g., the left side) of the corresponding memory cell array unit 110, and is coupled to the word lines WLx. The first word line driver 111 receives an address signal from outside the magnetoresistive memory device 1, and applies a voltage to a word line WLx selected on the basis of an address in the address signal, from among the word lines WLx coupled to the first word line driver 111.

The second word line driver 112 extends along one side (e.g., the lower side) of the corresponding memory cell array unit 110, and is coupled to the word lines WLy. The second word line driver 112 receives an address signal from outside the magnetoresistive memory device 1, and applies a voltage to a word line WLy selected on the basis of an address in the address signal, from among the word lines WLy connected to the second word line driver 112.

The source plate 13 extends along the xy plane over, for example, the entire memory cell array unit 110.

The WC/SA 113 is located between, for example, the first word line driver 111 and the second word line driver 112. The WC/SA 113 is coupled to the bit plate 11 and the source plate 13, receives a control signal from outside the magnetoresistive memory device 1, and applies read and write voltages to the bit plate 11 and the source plate 13 on the basis of the control signal. The WC/SA 113 determines data held in a memory cell 12 (not shown in FIG. 1) on the basis of the state of the memory cell 12.

FIG. 2 shows another layout example of components of the magnetoresistive memory device according to the embodiment. As shown in FIG. 2, each of unit structures 100 includes a memory cell array unit 110 and a WC/SA 113. A set of the unit structures 100 shares a single first word line driver 111, and another set of the unit structures 100 shares a single second word line driver 112. The first word line driver 111 extends across two or more unit structures 100 arranged along the y axis, and the second word line driver 111 extends across two or more unit structures 100 arranged along the x axis. The word lines WLx extend across the memory cell array units 110 arranged along the x axis on the outer side of the memory cell array unit 110, and are coupled to the first word line driver 111. The word lines WLx extend across the memory cell array units 110 arranged along the y axis on the outer side of the memory cell array unit 110, and are coupled to the second word line driver 112.

Figure 3:
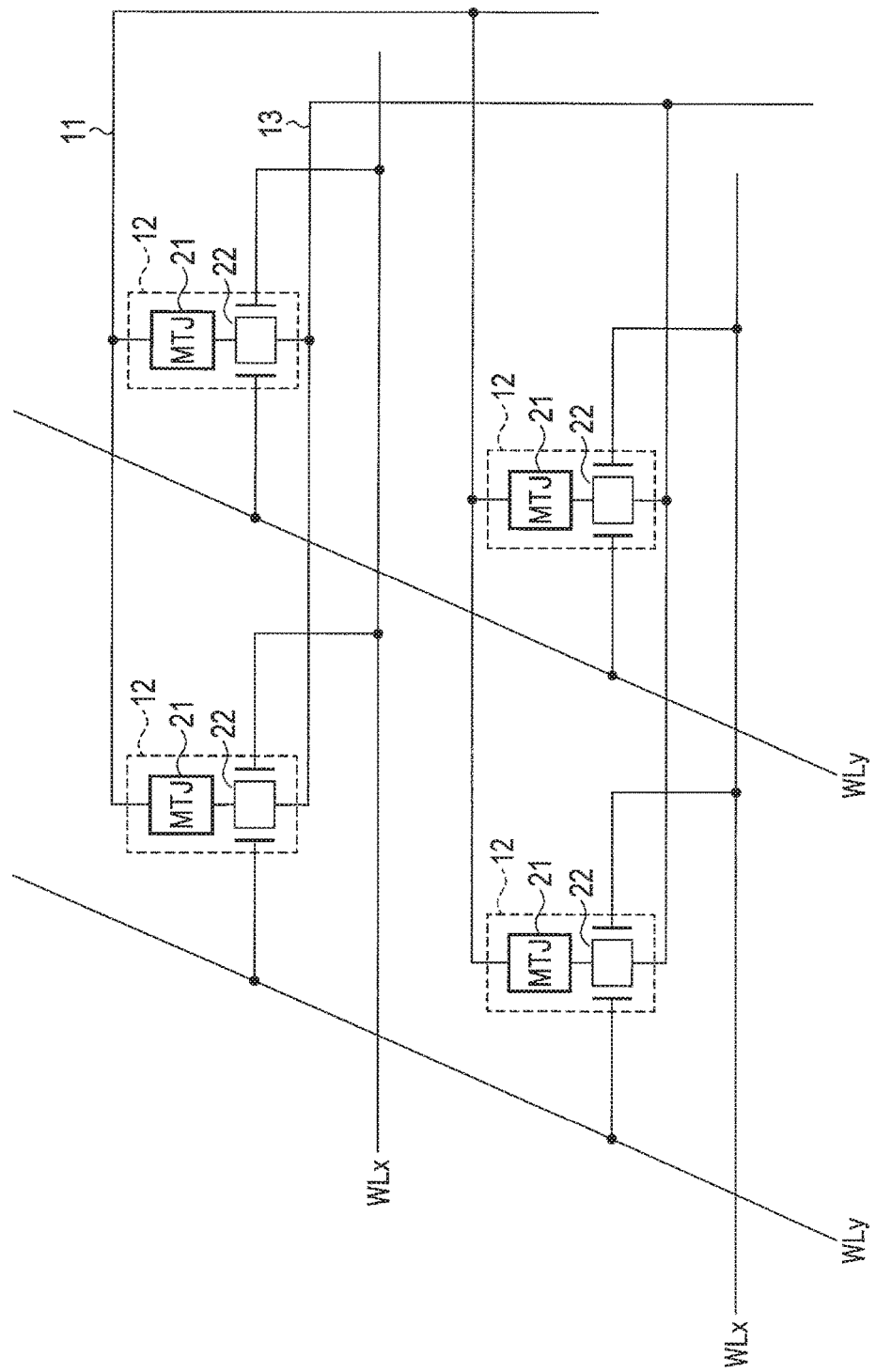
FIG. 3 shows a circuit diagram of part of a memory cell array unit according to the embodiment.

FIG. 3 is a circuit diagram showing part of the memory cell array unit 110 of the magnetoresistive memory device according to the embodiment. As shown in FIG. 3, each of memory cells 12 includes a magnetic tunnel junction (MTJ) element 21, and a double-gate metal-oxide-semiconductor field-effect transistor (MOSFET) 22. Details of the MTJ element 21 will be described later.

The double-gate MOSFET (double-gate transistor) 22 includes two gate electrodes sandwiching a channel region between a source and a drain. The transistor 22 is turned on when both of a first gate electrode and a second gate electrode receive a voltage of a high level, and lets a current flow between the source and the drain of the transistor 22. On the other hand, the transistor 22 is turned off when either or both of the first and second gate electrodes receive a voltage less than the high level (e.g., a low level). However, while one of the first and second gate electrodes of the transistor 22 is receiving a voltage of the high level, a larger leakage current flows between the source and the drain of the transistor 22 than in the state in which both of the first and second gate electrodes receive a voltage less than the high level. Hereinafter, when one of first and second gate electrodes of a transistor 22 receives a voltage less than the high level, the transistor 22 will be described as being in a high-leakage off state. On the other hand, when both of first and second gate electrodes of a transistor 22 receive a voltage less than the high level, the transistor 22 will be simply described as being in an off state.

In each memory cell 12, the transistor 22 is coupled between a first terminal of the MTJ element 21 and the source plate 13. A second terminal of the MTJ element 21 is coupled to the bit plate 11.

In each transistor 22, a first gate electrode is coupled to a corresponding one of the word lines WLx, and a second gate electrode is coupled to a corresponding one of the word lines WLy. Hereinafter, the first gate electrode will be referred to as an x gate electrode, and the second gate electrode will be referred to as a y gate electrode.

Each of the word lines WLx is coupled to respective x gate electrodes of the transistors 22 of memory cells 12. Each of the word lines Ly is coupled to respective y gate electrodes of the transistors 22 of memory cells 12.

Figure 4:
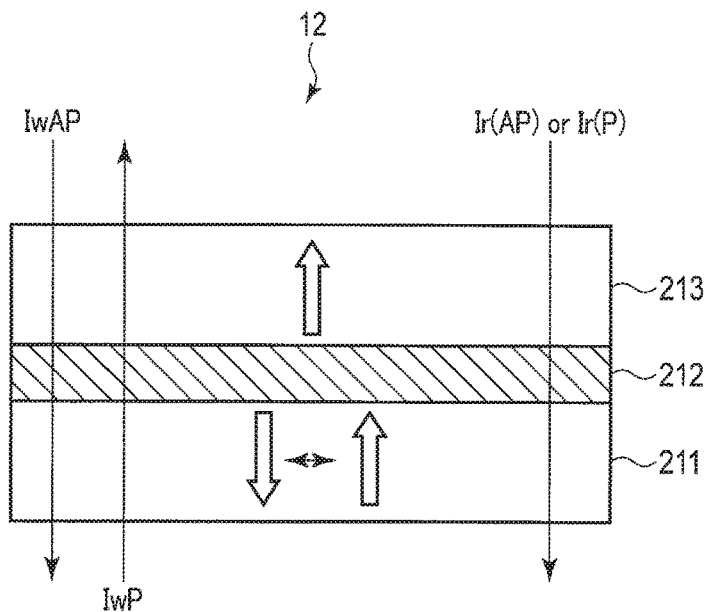
FIG. 4 shows a structure example of an MTJ element according to the embodiment.

FIG. 4 illustrates a structure example of the MTJ element 21 according to the embodiment. As shown in FIG. 4, the MTJ element 21 includes two ferromagnets 211 and 213, and a nonmagnet 212 between the ferromagnets 211 and 213. During a normal operation by the magnetoresistive memory device 1, the direction of magnetization of the ferromagnet 213 is invariable, whereas the direction of magnetization of the ferromagnet 211 is variable. The ferromagnets 211 and 213 have magnetization easy axes (indicated by the arrows) that penetrate the interfaces of the ferromagnet 211, the nonmagnet 212, and the ferromagnet 213. The ferromagnets 211 and 213 may have magnetization easy axes along the interfaces of the ferromagnet 211, the nonmagnet 212, and the ferromagnet 213. The nonmagnet 212 is, for example, an insulator.

A set of the ferromagnet 211, the nonmagnet 212, and the ferromagnet 213 exhibits a magnetoresistive effect. Specifically, the MTJ element 21 has a minimal resistance value when the magnetization directions of the ferromagnets 211 and 213 are parallel to each other. On the other hand, the MTJ element 21 has a maximal resistance value when the magnetization directions of the ferromagnets 211 and 213 are antiparallel to each other. The states that show two different resistance values may be respectively assigned to binary data.

When a write current IwP flows from the ferromagnet 211 toward the ferromagnet 213, the magnetization direction of the ferromagnet 211 becomes parallel to the magnetization direction of the ferromagnet 213. When the magnetization direction of the ferromagnet 211 is parallel to the magnetization direction of the ferromagnet 213 (or, in a P state), the MTJ element 21 is in a low-resistance state, and has a resistance value Rp.

When a write current IwAP flows from the ferromagnet 213 toward the ferromagnet 211, the magnetization direction of the ferromagnet 211 becomes antiparallel to the magnetization direction of the ferromagnet 213. When the magnetization direction of the ferromagnet 211 is antiparallel to the magnetization direction of the ferromagnet 213 (or, in an AP state), the MTJ element 21 is in a high-resistance state, and has a resistance value Rap.

For data reading, a proper voltage is applied to the bit plate 11 and the source plate 13. This voltage causes a current to flow through the MTJ element 21. By the application of the read voltage, a current Ir (AP) and a current Ir (P) flow from the ferromagnet 213 toward the ferromagnet 211, for example, when the MTJ element 21 is in the AP state and the P state, respectively. A resistance state of the MTJ element 21 is determined by the WC/SA 113 on the basis of the magnitude of the current Ir flowing through the MTJ element 21. When the current Ir is of a magnitude less than a certain reference value, the MTJ element 21 is determined as being in the AP state, and when the current Ir is of a magnitude equal to or greater than the reference value, the MTJ element 21 is determined as being in the P state.

The ferromagnet 213 having an "invariable" direction of magnetization means that the magnetization direction of the ferromagnet 213 is not changed (switched) by a current of a magnitude that could reverse the magnetization direction of the ferromagnet 211.

The ferromagnet 211 includes or consists of a layer of one or more electrically-conductive ferromagnetic materials. Specifically, the layer of the ferromagnet 211 includes one or more elements, such as iron (Fe), boron (B), and cobalt (Co), and includes, for example, cobalt iron boron (CoFeB), or iron boride (FeB). The ferromagnet 213 includes or consists of an alloy of Co, Fe, and B.

The nonmagnet 212 includes or consists of a non-magnetic insulating material, and functions as a tunnel barrier. The nonmagnet 212 includes or consists of, for example, magnesium oxide (MgO).

The ferromagnet 213 includes or consists of one or more electrically-conductive ferromagnetic materials. The layer of the ferromagnet 213 includes or consists of, for example, cobalt platinum (CoPt), cobalt nickel (CoNi), or cobalt palladium (CoPd).

Figure 5:
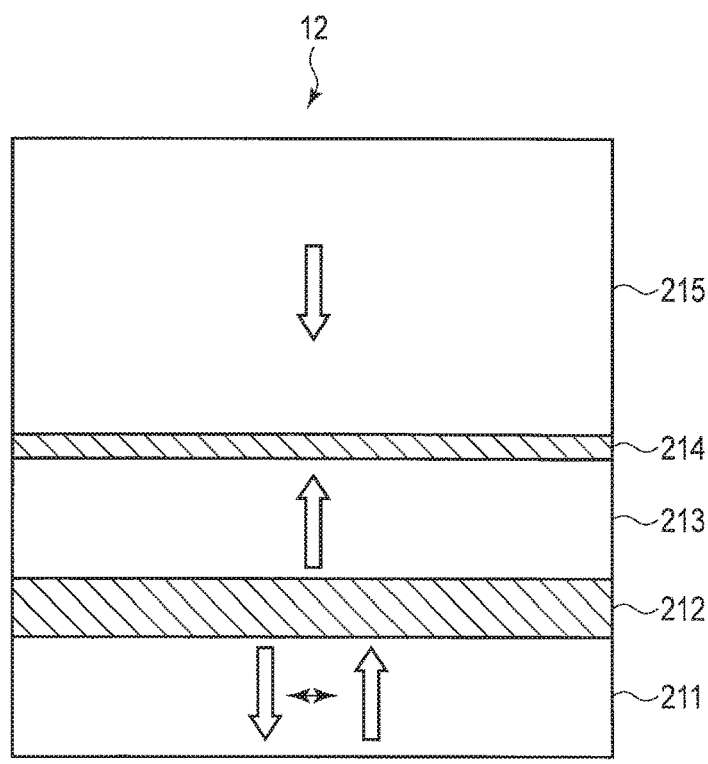
FIG. 5 shows another structure example of the MTJ element according to the embodiment.

The MTJ element 21 may include an additional layer. FIG. 5 shows such an example, and shows another structure example of the MTJ element 21 according to the embodiment. As shown in FIG. 5, the MTJ element 12 further includes a conductor 214 and a ferromagnet 215. The conductor 214 is located on a surface of the ferromagnet 213 opposite to the nonmagnet 212. The conductor 214 has a function of antiferromagnetically coupling the ferromagnet 213 and the ferromagnet 215 provided on top of the conductor 214, which will be described later. In other words, the ferromagnet 213, the conductor 214, and the ferromagnet 215 have a synthetic antiferromagnetic (SAF) structure. The conductor 214 includes or consists of, for example, Ru. It is known that Ru couples two magnetic materials between which an Ru layer is interposed magnetically or antiferromagnetically, in accordance with the thickness of Ru. The conductor 214 may further include a layer of Pt and/or Pd. The conductor 214 has a thickness capable of antiferromagnetically coupling the ferromagnet 213 and the ferromagnet 215.

The ferromagnet 215 is located on a surface of the conductor 214 opposite to the ferromagnet 213. The ferromagnet 215 has a function of suppressing a magnetic field generated by the ferromagnet 213 and applied to the ferromagnet 211, or a stray magnetic field. The ferromagnet 215 includes or consists of a layer of one or more electrically-conductive ferromagnetic materials. The ferromagnet 215 may consist of, for example, the same or substantially the same material as the material of the ferromagnet 213.

FIG. 6 shows a state of part of the memory cell array unit 110 during an operation according to the embodiment, and corresponds to FIG. 3. For selection of a memory cell 12, a transistor 22 (selected transistor 22s) of only a memory cell 12 be selected (selected memory cell 12s) is turned on, as shown in FIG. 6. Accordingly, the word line WLx coupled to the first gate electrode of the selected transistor 22s (, or a selected word line WLx) and the word line WLy coupled to the second gate electrode of the selected transistor 22s (, or a selected word line WLy) are set to a high level. The selected word lines WLx and WLy are indicated by the heavy lines.

During data reading and writing, only one selected word line WLx and one selected word line WLy are selected, and thus only one memory cell 12 is selected, in each of one or more memory cell array units 110 of all the memory cell array units 110. An address signal from outside the magnetoresistive memory device 1 specifies one word line WLx and one word line WLy in one memory cell array unit 110 to select one selected memory cell 12s.

The selected word line WLx having the high-level voltage sets the transistors 22 coupled to the selected word line WLx to a high-leakage off state, except for the selected transistor 22s. Similarly, the selected word line WLy having the high-level voltage sets the transistors 22 coupled to the selected word line WLy to a high-leakage off state, except for the selected transistor 22s. Memory cells including transistors 22 in a high-leakage off state will be hereinafter referred to as half-selected memory cells 12h. Of the memory cells 12, memory cells 12 including transistors 22 other than the selected memory cell 12s and the half-selected memory cells 12h, namely, memory cells 12 including transistors 22 in an off state, will be referred to as non-selected memory cells 12n.

During data reading or writing, voltages applied to the bit plate 11 and the source plate 13 cause a potential difference between the hit plate 11 and the source plate 13. This potential difference may cause a current to flow through some of the memory cells 12. When a write current IwAP or IwP or a read current Ir flows through the selected memory cell using the potential difference, data is read from or written into the selected memory cell 12s.

During the data writing or reading from the selected memory cell 12s, the transistors 22 of the half-selected memory cell 12h are in a high-leakage off state. Accordingly, a high leakage currant flows through the half-selected memory cells 12h during the data writing or reading. However, since the leakage current is smaller than the current that flows through the transistor 22 that is turned on, only a current that is smaller than the current that flows through the selected memory cell 12s flows through the half-selected memory cells 12h. On the basis of that, the transistors 22 may have a current drivability that satisfies both the first condition and the second condition that will be described below. Note that the MTJ elements 21 of the respective half-selected memory cells 12h may be either in the P state or the AP state.

Figure 7:
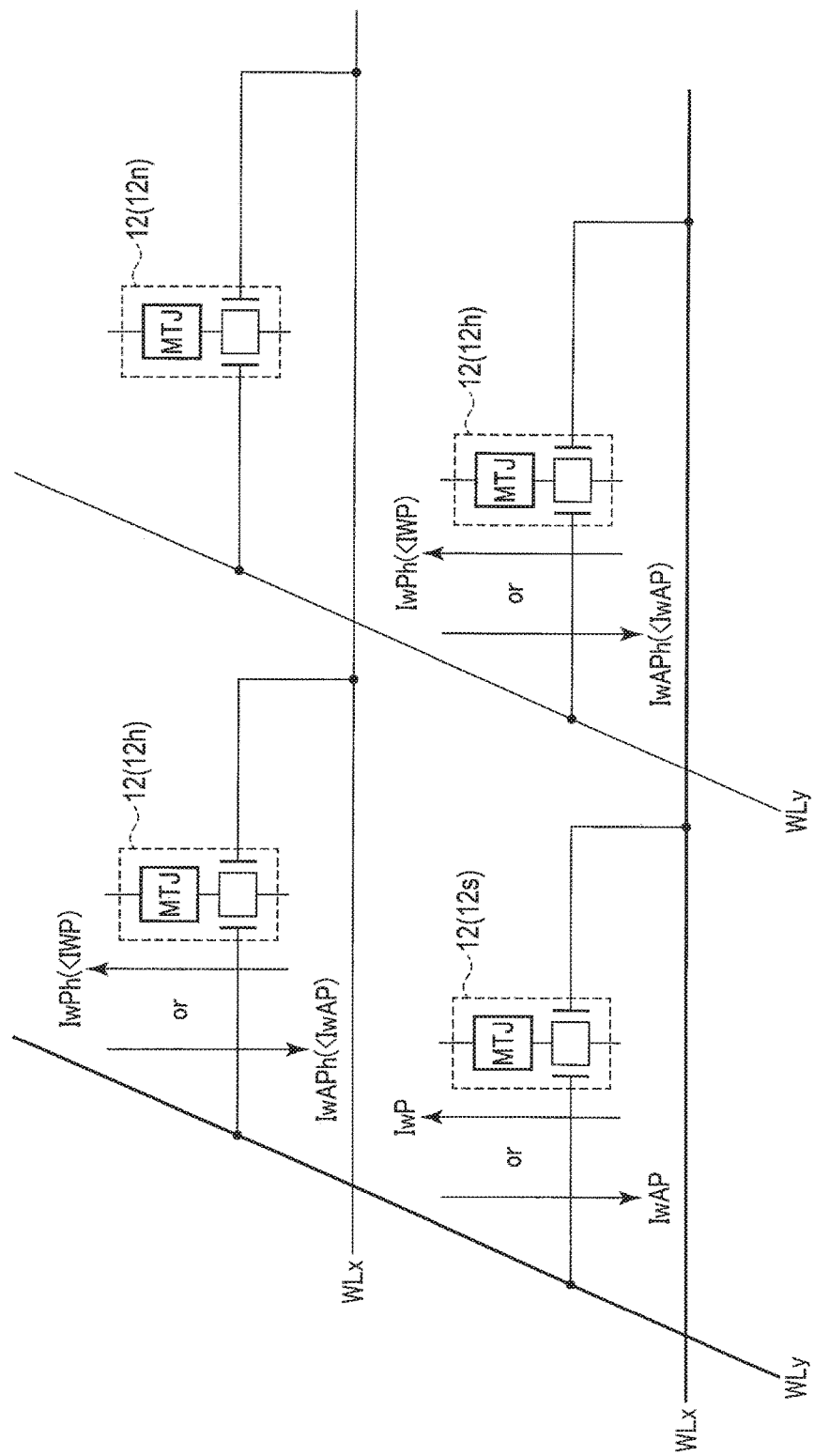
FIG. 7 shows a state of part of circuitry of the magnetoresistive memory device according to the embodiment.

The first condition is that write currents IwAP and IwP flow through the selected memory cell 12s and only current IwAPh less than the write current IwAP and a current IwPh less than the write current IwP flow through the half-selected memory cells 12h, as shown in FIG. 7.

Figure 8:
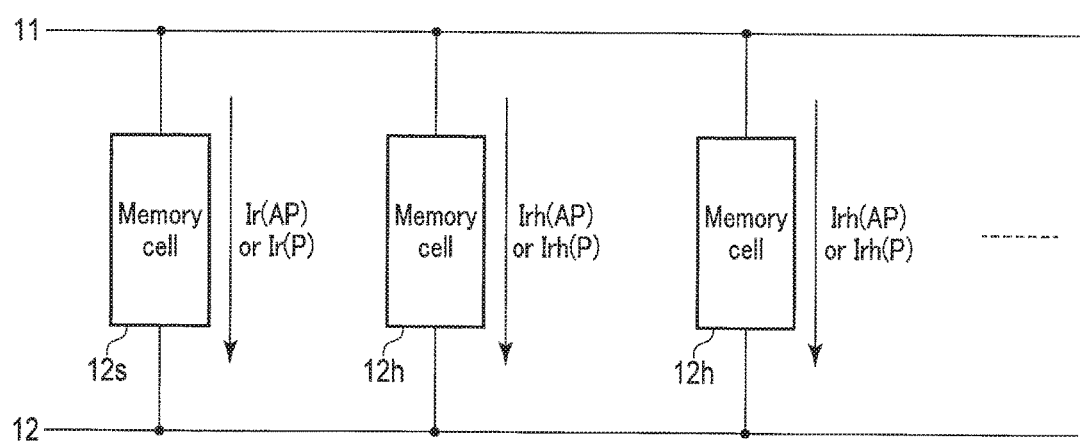
FIG. 8 shows a state of part of circuitry of the magnetoresistive memory device according to the embodiment.

The second condition is that the WC/SA 113 is capable of determining whether the selected memory cell 12s is in the AP state or the P state, even when a current flows through the selected memory cell 12s and the half-selected memory cell 12h during data reading, as shown in FIG. 8. That is, by application of a read voltage between the bit plate 11 and the source plate 13, a current Irh flows via a half-selected memory cell 12h, in addition to the current Ir that flows via the selected memory cell 12s whose resistance state is to be determined, between the bit plate 11 and the source plate 13. Even when the currents Irh flow, it is required that determination be made as to whether the MTJ element 21 of the selected memory cell 12s is in the AP state or the P state, on the basis of the magnitude of the current Ir that flows through the selected memory cell 12s. The second condition is that such determination can be made. The read currents Irh that flows through the half-selected memory cell 12h are dependent on the resistance state of the MTJ elements of the half-selected memory cells 12h. When the MTJ element 21 is in the AP state, a read current Irh (AP) flows therethrough, and when the MTJ element 21 is in the P state, a read current Irh (P) flows therethrough. The magnitude of the read current Irh is unknown. In consideration of that, it is necessary that the current Ir (AP) that flows through the selected memory cell 12s in the AP state and the current Ir (P) that flows through the selected memory cell 12h in the P state have a margin for accurate data reading.

Note that the transistor 22 is turned off in the non-selected memory cell 12n during the reading and writing.

Figure 9:
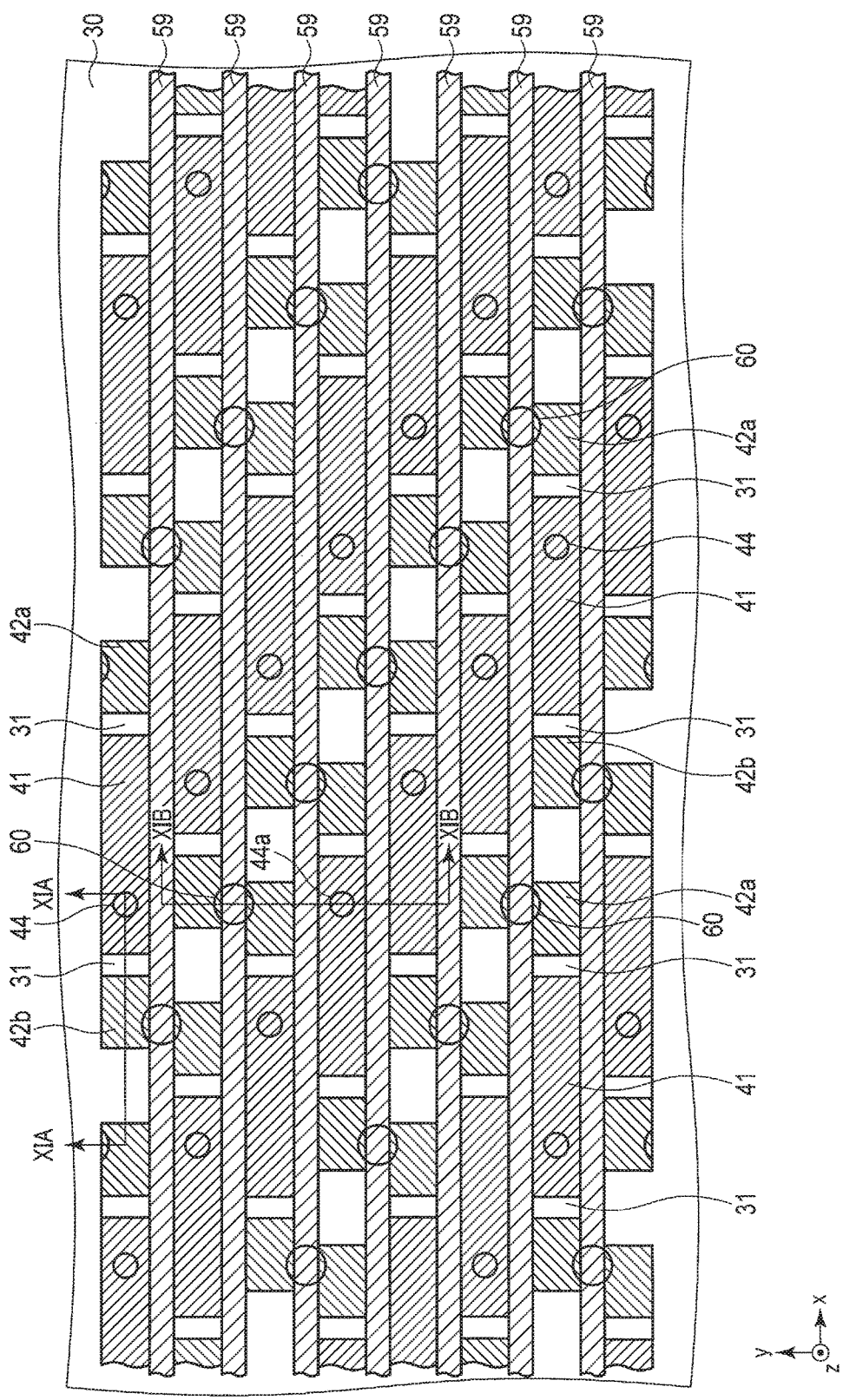
FIG. 9 shows a planar structure of part of the memory cell array unit according to the embodiment.
Figure 10:
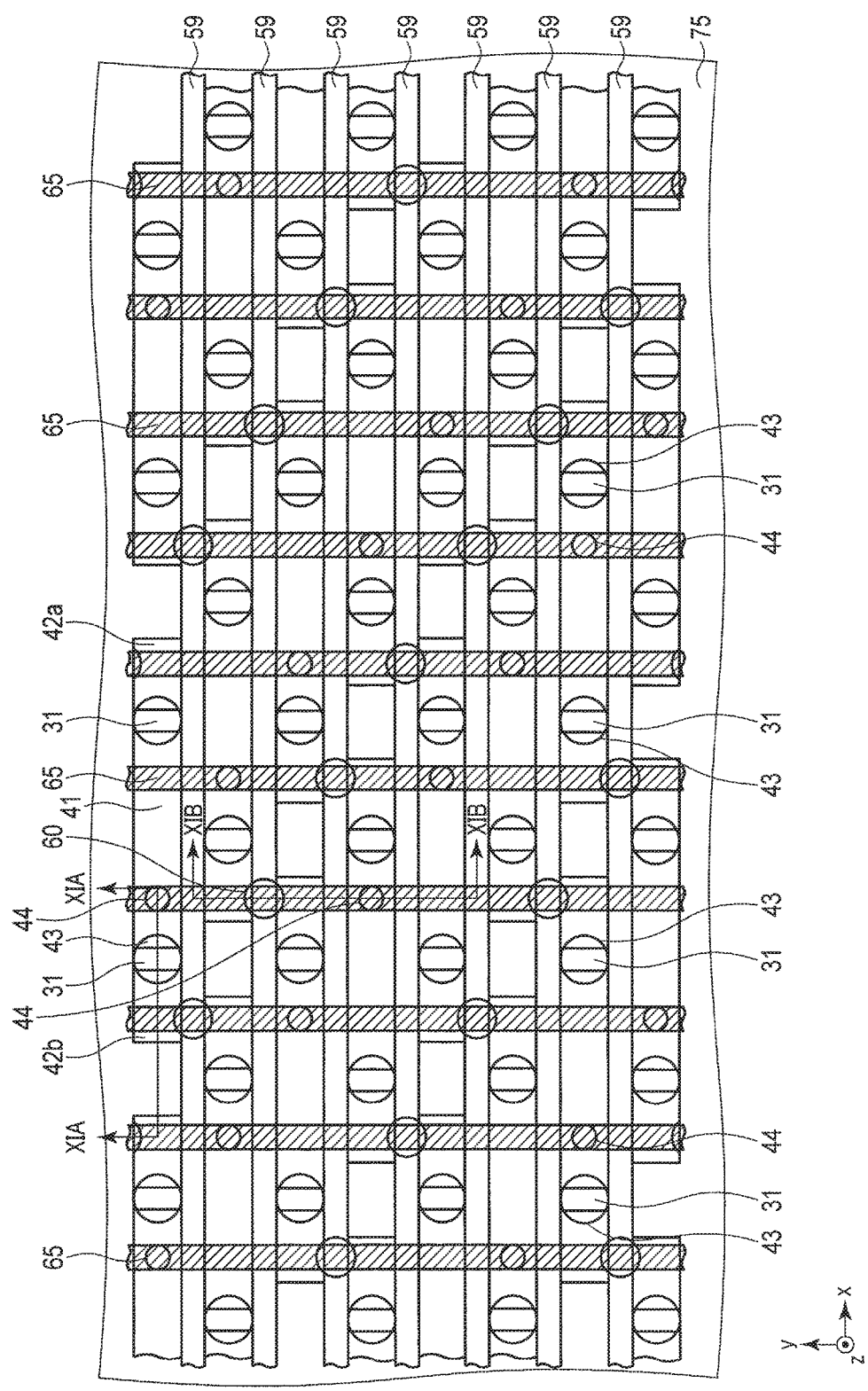
FIG. 10 shows a planar structure of another part of the memory cell array unit according to the embodiment.
Figure 11:
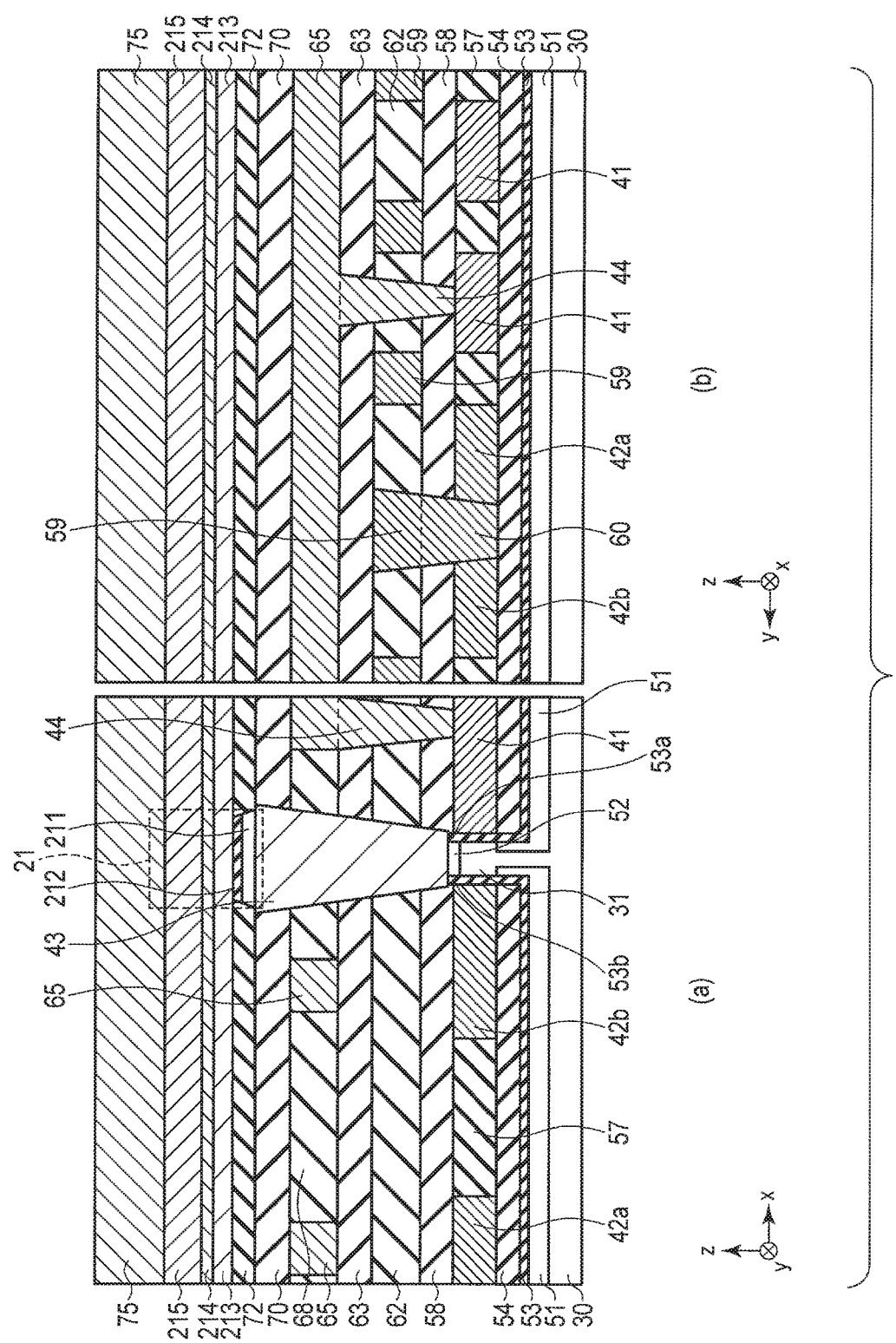
FIG. 11 shows a cross-sectional structure of part of the memory cell array unit according to the embodiment.

FIGS. 9, 10, and 11 show a structure of part of the memory cell array unit 110 according to the embodiment. In FIGS. 9 and 10, the structure is shown along the xy-plane. FIG. 9 shows layers from the lowest to some higher ones along the z axis. FIG. 10 shows layers higher than those of FIG. 9 along the z axis. FIG. 11(a) shows a structure taken along line XIA-XIA in FIGS. 9 and 10. FIG. 11(b) shows a structure taken along line XIB-XIB in FIGS. 9 and 10. In FIGS. 9 and 10, some of the components shown in FIG. 11 are not shown for simplification and easy visibility. FIG. 11 shows an example of the MTJ element 21 with the configuration shown in FIG. 5.

As shown in FIGS. 9, 10, and 11, a substrate 30 of monocrystalline silicon, for example, is disposed. The substrate 30 extends along the xy plane, and includes a plurality of protrusions 31 that protrude along the z axis from a surface (upper surface) of the upper side with respect to the z axis. Some of the protrusions 31 are arranged at intervals along the x axis, and constitute a row. Rows of the protrusions 31 are provided at intervals with respect to the y axis. An x axis coordinate of a protrusion 31 in one of two vertically adjacent rows of the protrusions 31 as viewed in the xy plane is different from an x axis coordinate of a protrusion 31 in the other row. A plug 43 is provided on each of the protrusions 31.

The substrate 30 includes impurity regions 51 in a surface portion of its upper surface. An impurity region 51 includes impurities that provide the substrate 30 with conductivity, extends along the xy-plane, and functions as a source of the transistor 22 and the source plate 13.

An insulator 53 is provided on the upper surface of the substrate 30 and on side surfaces of the protrusions 31. The insulator 53 covers the side surfaces of the protrusions 31, functions as gate insulators of the transistors 22, and includes or consists of a silicon oxide. The insulator 53 includes a portion 53a and a portion 53b. The portions 53a and 53b of the insulator 53 will be hereinafter referred to as insulators 53a and 53b. The insulator 53a corresponds to the portion of the right side surface of each protrusion 31, and the insulator 53b corresponds to the portion of the left side surface of each protrusion 31. The insulator 53 may be disposed on the upper surface of the substrate 30 as well. FIG. 11 shows such an example.

The insulator 53 is covered by insulators 54, except for the portions on the side surfaces of the protrusions 31, or the insulators 53a and 53b. The insulators 54 include or consist of, for example, silicon nitride.

Gate electrodes 41, gate electrodes 42a, and gate electrodes 42b are disposed in the layer on top of the layer of the insulator 54. A right side surface of each of the gate electrodes 41 is in contact with one protrusion 31 via one insulator 53b, and a left side surface of each gate electrode 41 is in contact with another protrusion 31 via one insulator 53a. Each gate electrode 41 functions as a y-gate electrode of a corresponding transistor 22, which will be hereinafter referred to as a y gate electrode 41.

A left side surface of each of the gate electrodes 42a is in contact with one protrusion 31 via one insulator 53a. A right side surface of each of the gate electrodes 42b is in contact with one protrusion 31 via one insulator 53b. An upper side of each gate electrode 42a with respect to the y axis faces a corresponding one of the gate electrodes 42b. Each of the gate electrodes 42 functions as an x-gate electrode of a corresponding transistor 22, which will be hereinafter referred to as an x gate electrode 42, and faces a corresponding y gate electrode 41, with one protrusion 31 sandwiched therebetween.

The y gate electrodes 41 and the x gate electrodes 42 belonging to the same row are electrically separated from one another. The x gate electrodes 42 belonging to different rows are electrically separated from one another. Plugs 60 are disposed for respective pairs of an x gate electrode 42a and an x gate electrode 42b arranged along the y axis, each between the x gate electrode 42a and the x gate electrode 42b with its side surfaces in contact with x gate electrodes 42a and 42b. Each plug 60 is aligned, along the y axis, with another plug 60 located between the fourth and fifth rows in the upper direction from the row to which the x gate electrode 42 that is in contact with that plug 60 belongs.

Each y gate electrode 41 is connected at its top to a bottom of a corresponding one of plugs 44. Each plug 44 is aligned, along the y axis, with another plug 44 in the third row in the upper direction from the row to which that plug 44 belongs.

The layer of the gate electrodes 42a and 42b is provided with an insulator 57 in areas free from the y gate electrode 41, the x gate electrode 42, and the plug 60. The insulators 57 include or consist of, for example, silicon oxide, functions as an interlayer film of the y gate electrode 41 and the x gate electrode 42, and electrically separates the y gate electrode 41 and the x gate electrode 42.

An impurity region 52 is provided in a surface portion of top of each protrusion 31. Each impurity region 52 functions as a drain of a corresponding transistor 22.

The layer on top of the layer of the y gate electrode 41, the x gate electrode 42, and the insulator 57 is provided with an insulator 58 in areas free from the plugs 44, the plugs 60, and the plugs 43.

Conductors 59 are disposed in the layer on top of the layer of the insulator 58. The conductors 59 extend along the x axis, arranged at intervals along the y axis, and function as word lines WLx, which will be hereinafter referred to as x word lines 59. Each of the x word lines 59 is located above the area between an x gate electrode 42b and an x gate electrode 42a arranged in the vertical direction as viewed in the xy plane, above the area between an x gate electrode 42a and a y gate electrode 41 arranged in the vertical direction as viewed in the xy plane, above the area between two y gate electrodes 41 arranged in the vertical direction as viewed in the xy plane, and above the area between a y gate electrode 41 and an x gate electrode 42b arranged in the vertical direction as viewed in the xy plane.

The bottom of each x word line 59 is, in parts between an x gate electrode 42a and an x gate electrode 42b arranged in the vertical direction as viewed in the xy plane, connected to top of plugs 60.

The layer of the x word lines 59 is provided with an insulator 62 in areas free from the x word lines 59 and the plugs 43 and 44. The insulator 62 includes or consists of, for example, silicon oxide, and electrically separates the x word lines 59 from one another.

The layer on top of the layer of the x word lines 59 and the insulator 62 is provided with an insulator 63 in areas free from the plugs 44 and 43. The insulator 63 includes or consists of silicon nitride.

Conductors 65 are provided in the layer on top of the layer of the insulator 63. The conductors 63 extend along the y axis, and are arranged at intervals along the x axis. The conductors 65 function as word lines WLy, which will be hereinafter referred to as y word lines 65. Each of the y word lines 65 is located, along the z axis, above the plugs 44 and 60 aligned as viewed in the xy plane. A bottom of each of the conductors 65 is in contact with bottoms of respective plugs 44 located below the conductor 65.

The layer of the y word lines 65 is provided with an insulator 68 in areas free from the y word lines 65 and the plugs 43. The insulator 68 includes or consists of, for example, silicon oxide, and electrically separates the y word lines 65 from one another.

The layer on top of the layer of the y word lines 65 and the insulator 68 is provided with an insulator 70 in areas free from the plugs 43. The insulator 70 includes or consists of, for example, silicon oxide.

Each plug 43 extends across the layer of the insulator 70, the layer of the y word lines 65 and the insulator 68, the layer of the insulator 63, the layer of the x word lines 59 and the insulator 62, and the layer of the insulator 58s, and is in contact at its bottom with a top of a corresponding protrusion 31.

On a top of each electrode 43, a corresponding ferromagnet 211 is provided. On a top of a ferromagnet 211, a corresponding nonmagnet 212 is provided. The layer of the ferromagnets 211 and the nonmagnets 212 is provided with an insulator 72 in areas free from the ferromagnets 211 and the nonmagnets 212. The insulator 72 electrically separates the ferromagnets 211 from one another.

One ferromagnet 213 is provided in the entire area in the layer on top of the layer of the insulator 72, so as to extend across the entire memory cell array unit 110. The ferromagnet 213 is at its bottom in contact with the tops of the nonmagnets 212.

One conductor 214 is provided on a top of the layer of the ferromagnet 213, to extend across the entire memory cell array unit 110. That is, one conductor 214 is shared by multiple MTJ elements 21.

One ferromagnet 215 is provided on top of the conductor 214, so as to extend across the entire memory cell array unit 110. That is, one ferromagnet 215 is shared by multiple MTJ elements 21.

A stack of a ferromagnet 211 and a nonmagnet 212 and portions of a ferromagnet 213, a conductor 214 and a ferromagnet 215 above the nonmagnet 212 constitutes one MTJ element 21.

On a top of the ferromagnet 215, a conductor 75 is provided so as to extend across the entire memory cell array unit 110. The conductor 75 functions as a bit plate 11.

A ferromagnet 213, a conductor 214, and/or a ferromagnet 215 may be independently provided for each MTJ element 21.

A manufacturing process of the structure shown in FIGS. 9-11 will be described with reference to FIGS. 12 to 27, The set of FIGS. 12 and 13, the set of FIGS. 14, 15, 16, 17, 18, and 19, the set of FIGS. 20, 21, and 22, the set of FIGS. 23, 24, 25, and 26, and FIG. 27 sequentially show the states of the magnetoresistive memory device 1 during the manufacturing process. Each of FIGS. 13(a), 14(a), 15(a), 16(a), 17(a), 19(a), 20(a), 22(a), 23(a), 24(a), 26(a), and 27(a) shows a cross section taken along line XIA-XIA in FIGS. 9 and 10. Each of FIGS. 13(b), 14(b), 15(b), 16(b), 17(b), 19(b), 20(b), 22(b), 23(b), 24(b), 26(b), and 27(b) shows a cross section taken along line XIB-XIB in FIGS. 9 and 10.

Figure 12:
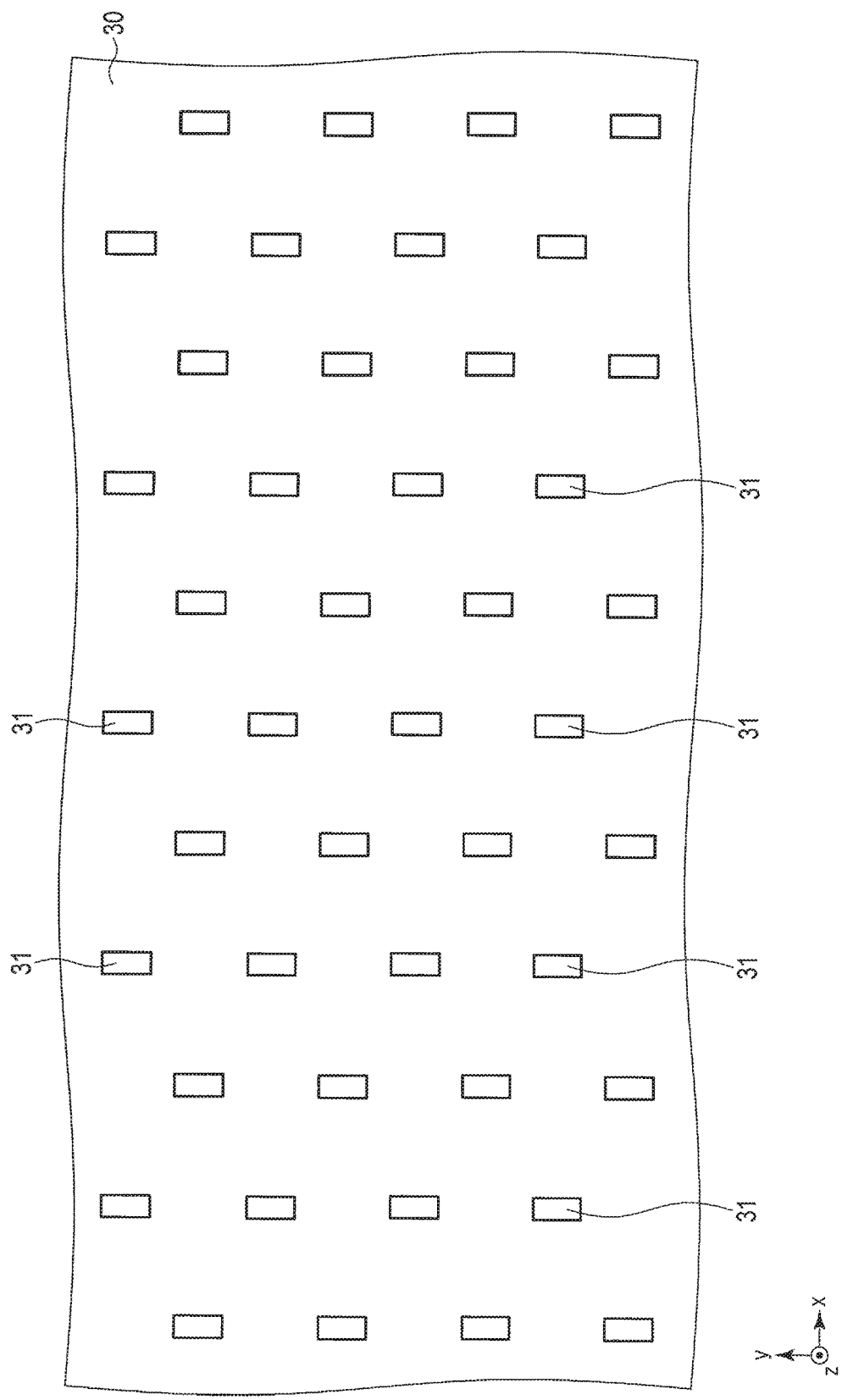
FIG. 12 shows another planar structure at a certain point in time during a manufacturing process of the magnetoresistive memory device according to the embodiment.
Figure 13:
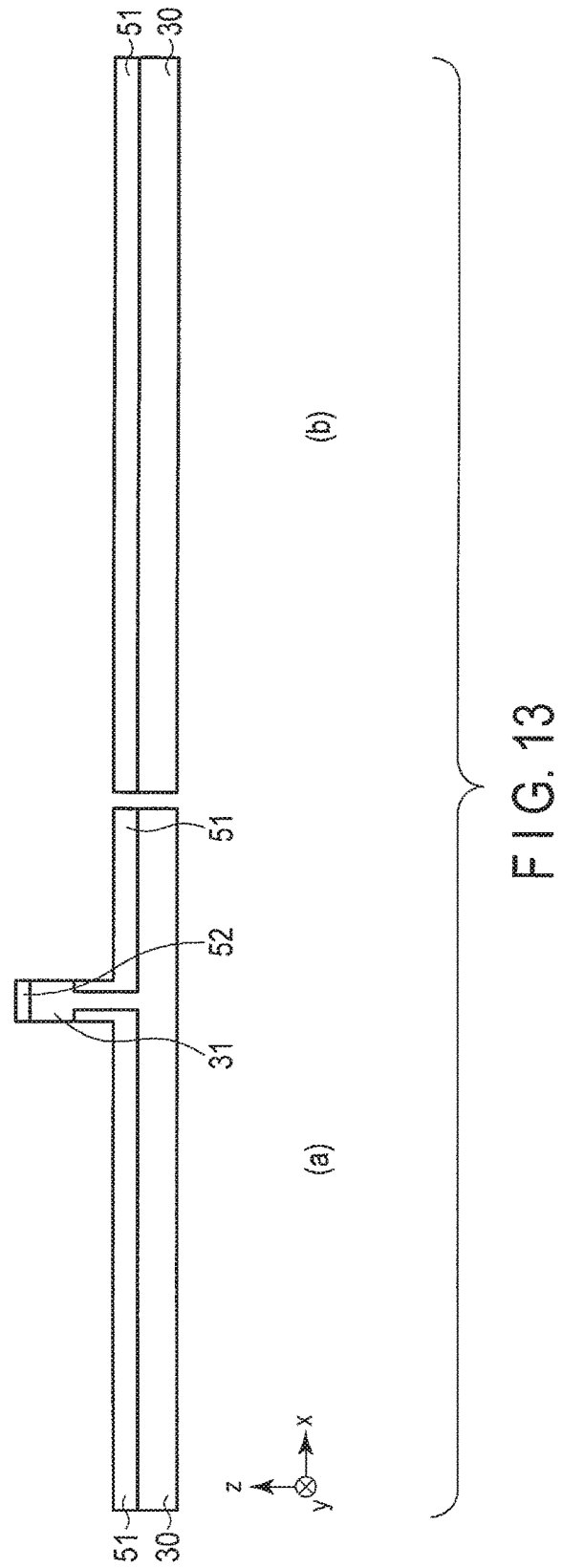
FIG. 13 shows a cross-sectional structure of FIG. 12.

As shown in FIGS. 12 and 13, the protrusions 31 are formed on the substrate 30 as follows. A mask (not shown) is formed on the entire surface of the substrate 30 having a flat upper surface (with no protrusions 31 formed thereon). The mask has openings in areas in which the protrusions 31 are not to be formed. The protrusions 31 are formed by partially etching the upper surface of the substrate 30 using the mask, such as reactive ion etching (RIE). The mask is then removed.

Ions are implanted in the structure obtained by the process so far, and thereby impurity regions 51 are formed in a surface portion of the upper surface of the substrate 30, and impurity regions 52 are formed in surface portions of upper surfaces of the protrusions 31. The impurity regions 51 are not shown in FIG. 12.

Figure 14:
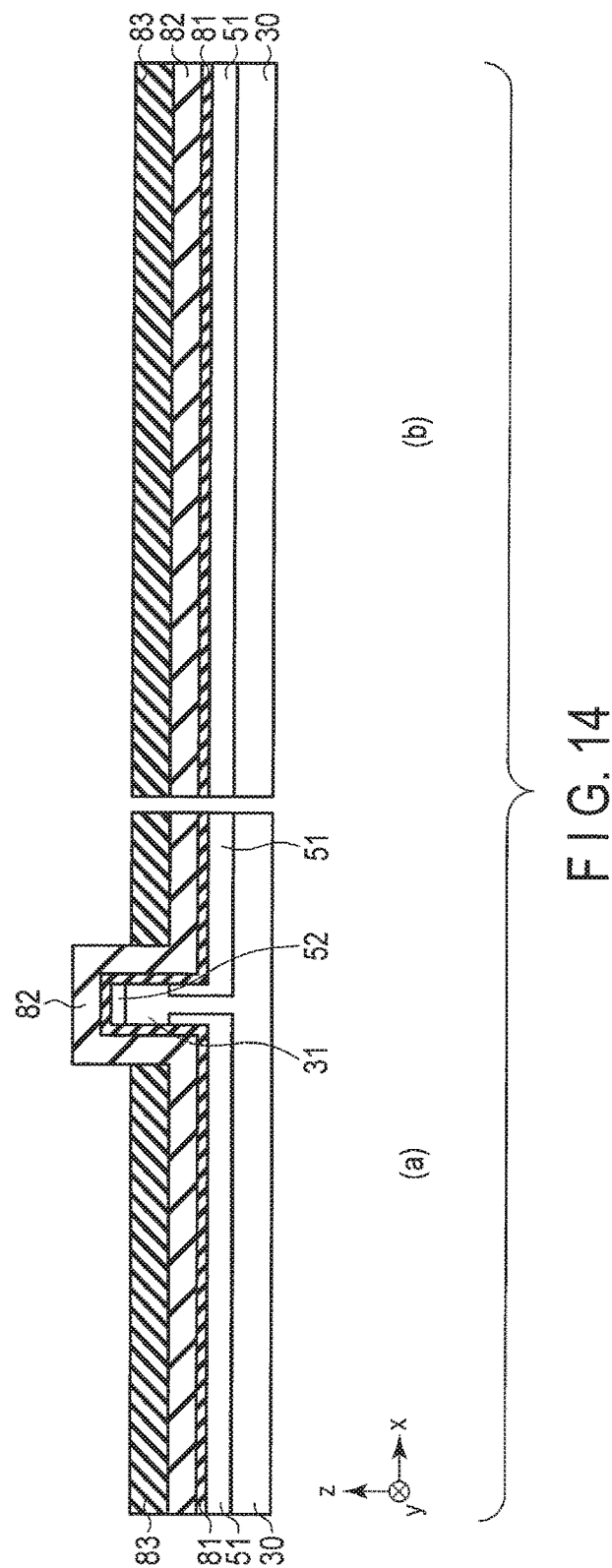
FIG. 14 shows a cross-sectional structure of the magnetoresistive memory device during the manufacturing process subsequent to FIG. 13 according to the embodiment.

As shown in FIG. 14, an insulator 81 is formed on the entire upper surface of the structure obtained by the process so far. The insulator 81 covers the upper surface of the substrate 30 and the tops and side surfaces of the protrusions 31. The insulator 81 is a layer of silicon oxide, for example, and is formed by, for example, thermal oxidation.

An insulator 82 is formed on the entire top of the insulator 81. A resist film 83 is formed on a top of the insulator 82 except the portion above protrusions 31 Portions of the insulator 82 above the tops of protrusions 31 are exposed.

As shown in FIG. 15, the portions of the insulator 82 exposed from the resist film 83, namely, the portions above the tops of protrusions 31 and the upper portions of the side portions of the protrusion 31 are removed by wet etching, for example. As a result, the insulators 54 are obtained.

Figure 16:
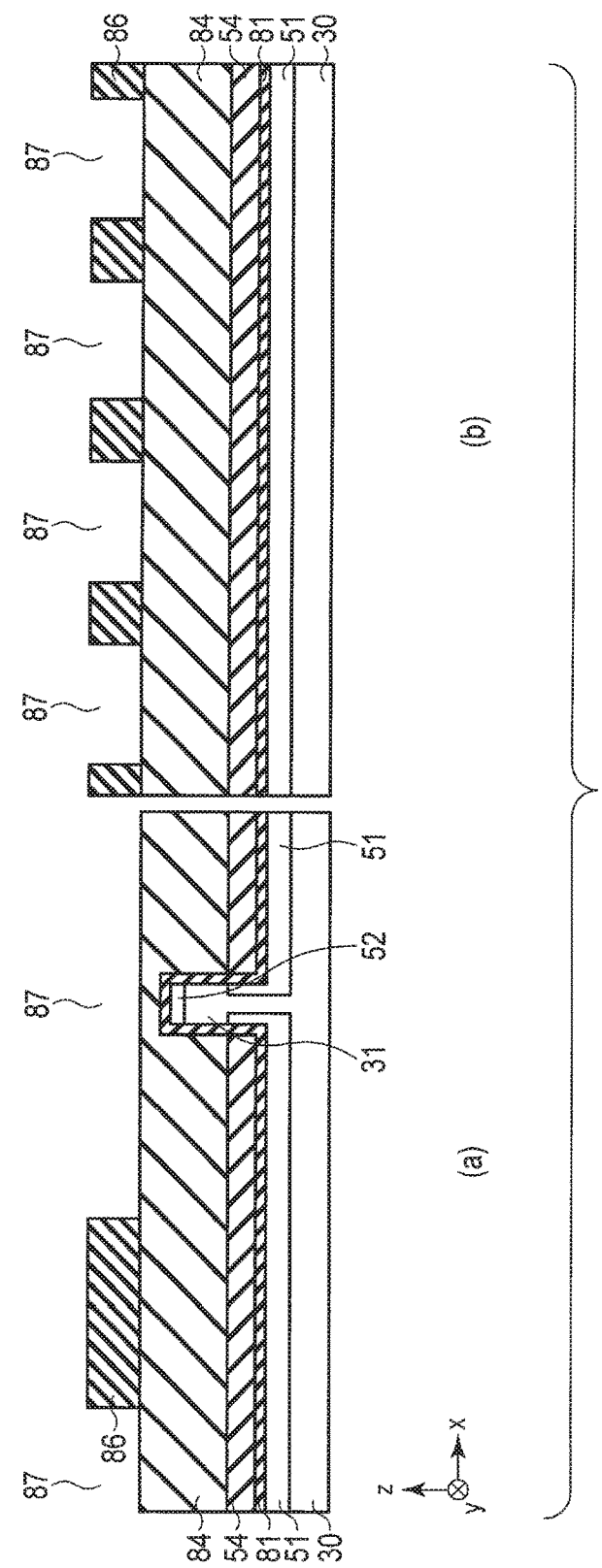
FIG. 16 shows a cross-sectional structure of the magnetoresistive memory device during the manufacturing process subsequent to FIG. 15 according to the embodiment.

As shown in FIG. 16, an insulator 84 is formed on the entire tops of the insulators 54, and a mask material 86 is formed on the entire top of the insulator 84. The mask material 86 includes openings 87 above the areas in which conductors 42a and 42b are to be formed.

Figure 17:
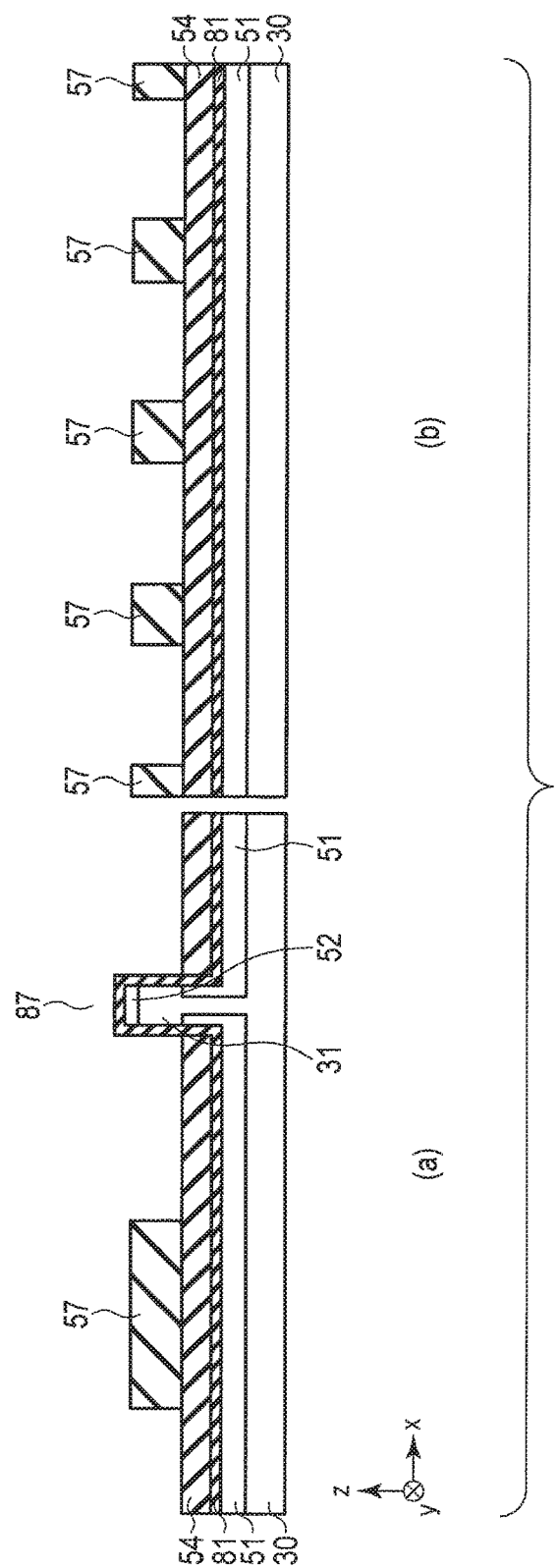
FIG. 17 shows a cross-sectional structure subsequent to FIG. 16 during the manufacturing process of the magnetoresistive memory device according to the embodiment.

As shown in FIG. 17, the insulator 84 is etched by etching such as RIE, using the mask material 86 as a mask, and the portions of the insulator 84 below the openings 87 are removed.

Figure 19:
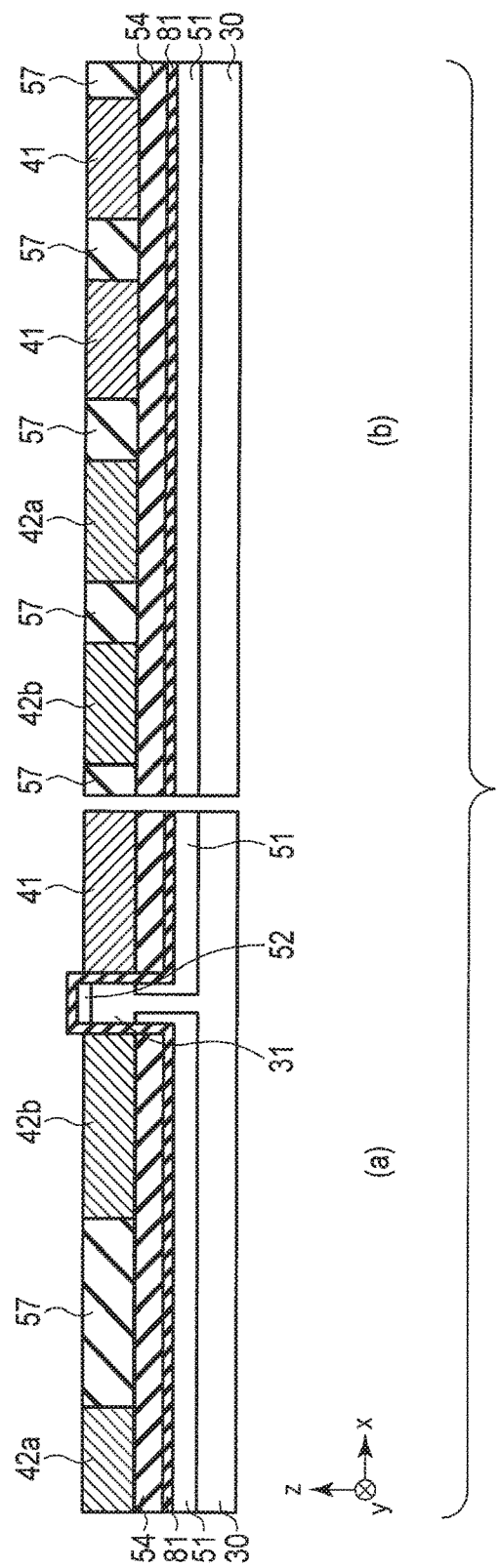
FIG. 19 shows a cross-sectional structure of the magnetoresistive memory device during the manufacturing process subsequent to FIG. 17 according to the embodiment.

As shown in FIGS. 18 and 19, conductors 41 and 42 are formed as follows. A conductor (not shown) is formed on the entire top of the structure obtained by the process so far. The conductor is partly located in areas between the insulators 57, namely, in areas in which the conductors 41 and 42 are to be formed, and fill the areas in which the conductors 41 and 42 are to be formed, for example. The top of the conductor is polished by, for example, chemical mechanical polishing (CMP), and then the polished top is etched back to a height that is the same as or similar to the height of the tops of the insulators 57. As a result, conductors 41 and 42.

As shown in FIG. 20, an insulator 89 is formed on the entire top of the structure obtained by the process so far, and an insulator 90 is formed on the entire top of the insulator 89.

As shown in FIGS. 21 and 22, trenches 92 for the x word lines 59 and holes 93 for plugs 60 are formed by, for example, a dual damascene process. The trenches 92 are formed in areas of the insulator 90 in which the x word lines 59 are to be formed. The holes 93 are formed in areas of the insulators 89 and 57 in which the plugs 60 are to be formed, and are in contact with side surfaces of x gate electrodes 42a and 42b of respective pairs of conductors 42a and 42b arranged along the y axis.

As shown in FIG. 23, conductors are formed in the trenches 92 and the holes 93, and thereby the x word lines 59 and the plugs 60 are formed. The x word lines 59 and the plugs 60 may be formed by single damascene processes.

Figure 24:
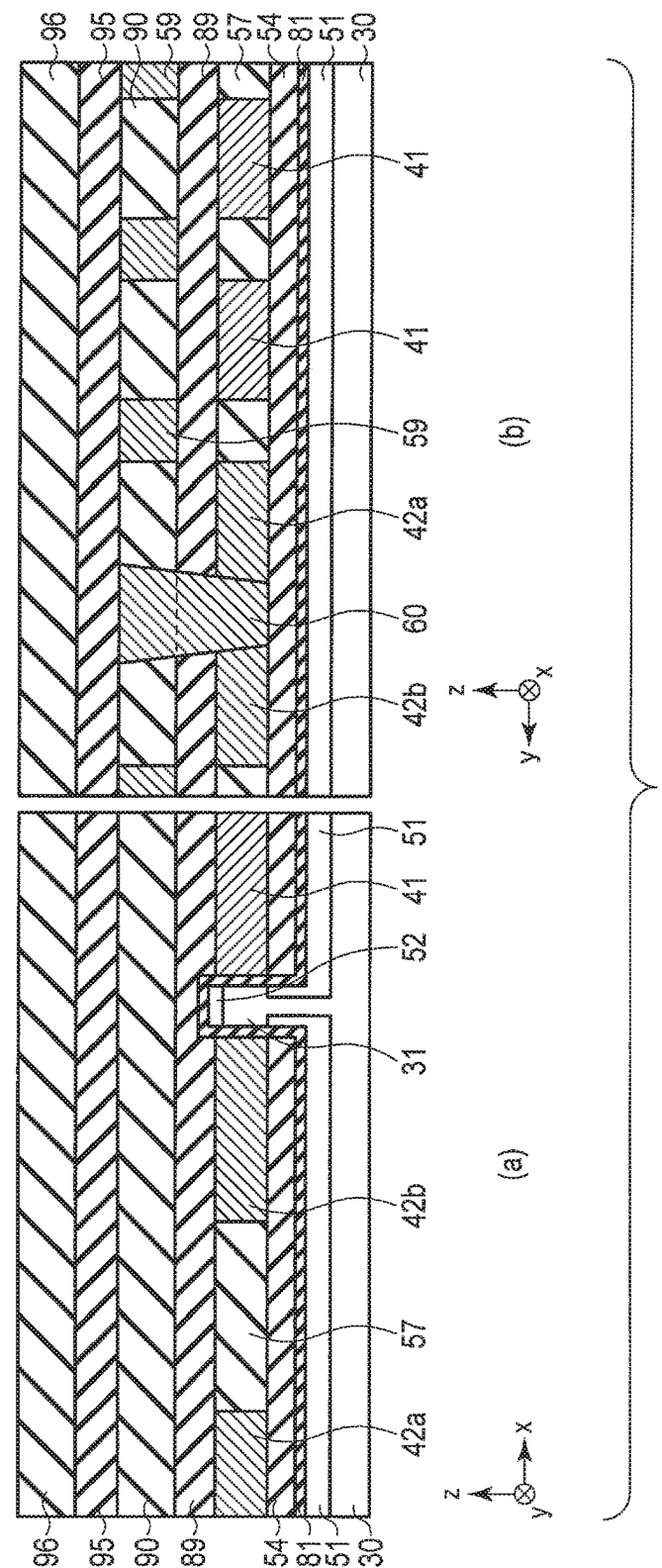
FIG. 24 shows a cross-sectional structure of the magnetoresistive memory device during the manufacturing process subsequent to FIG. 23 according to the embodiment.

As shown in FIG. 24, an insulator 95 is formed on the entire top of the structure obtained by the process so far, and an insulator 96 is formed on the entire top of the insulator 95.

Figure 25:
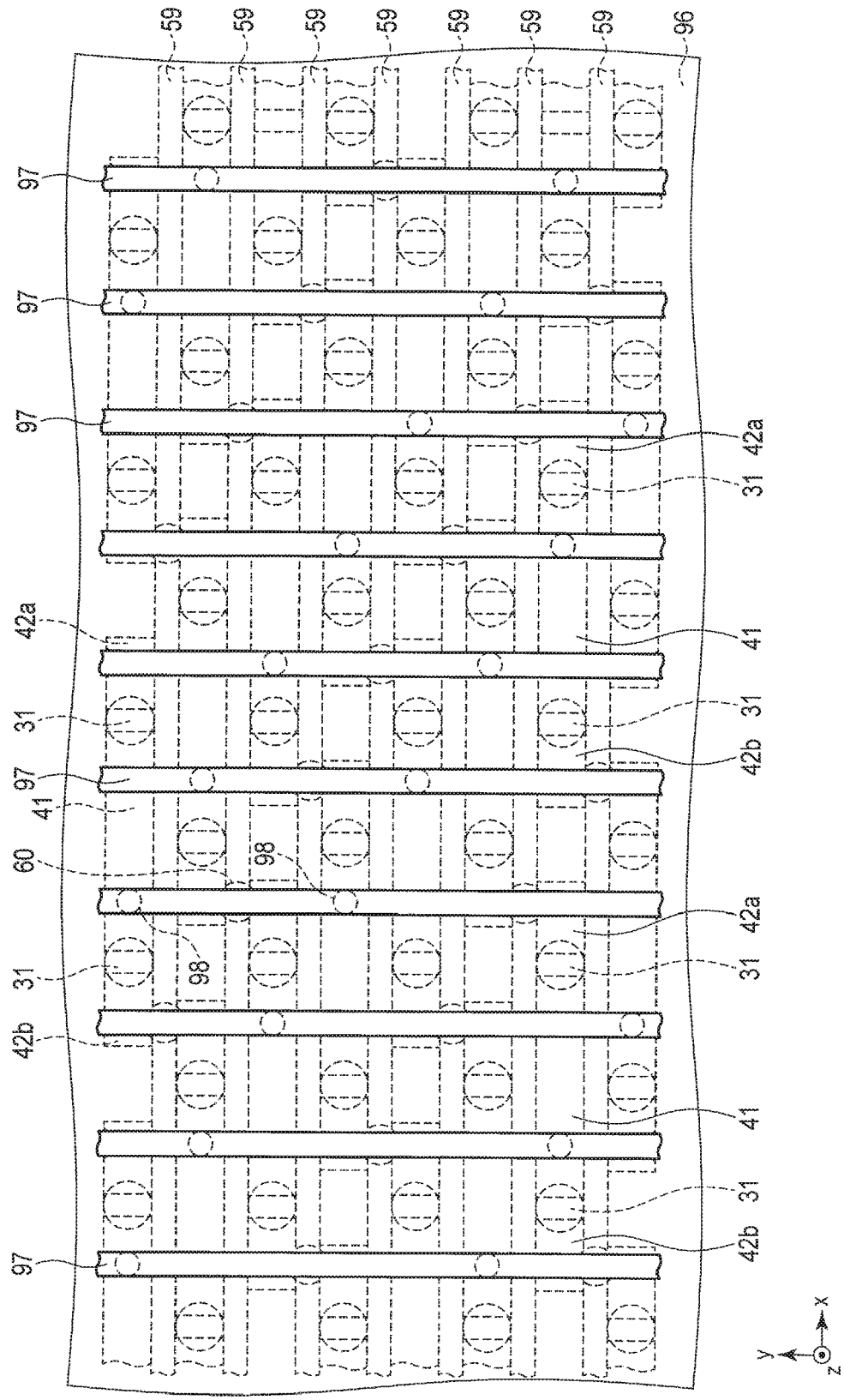
FIG. 25 shows a planar structure of the magnetoresistive memory device during the manufacturing process subsequent to FIG. 24 according to the embodiment.

As shown in FIGS. 25 and 26, trenches 97 for the y word lines 65 and holes 98 for the plugs 44 are formed by, for example, a dual damascene process. The trenches 97 are formed in areas of the insulator 96 in which the y word lines 65 are to be formed. The holes 98 are formed in areas of the insulators 95, 90, and 89 in which the plugs 44 are to be formed, and reach the y gate electrodes 41.

Figure 27:
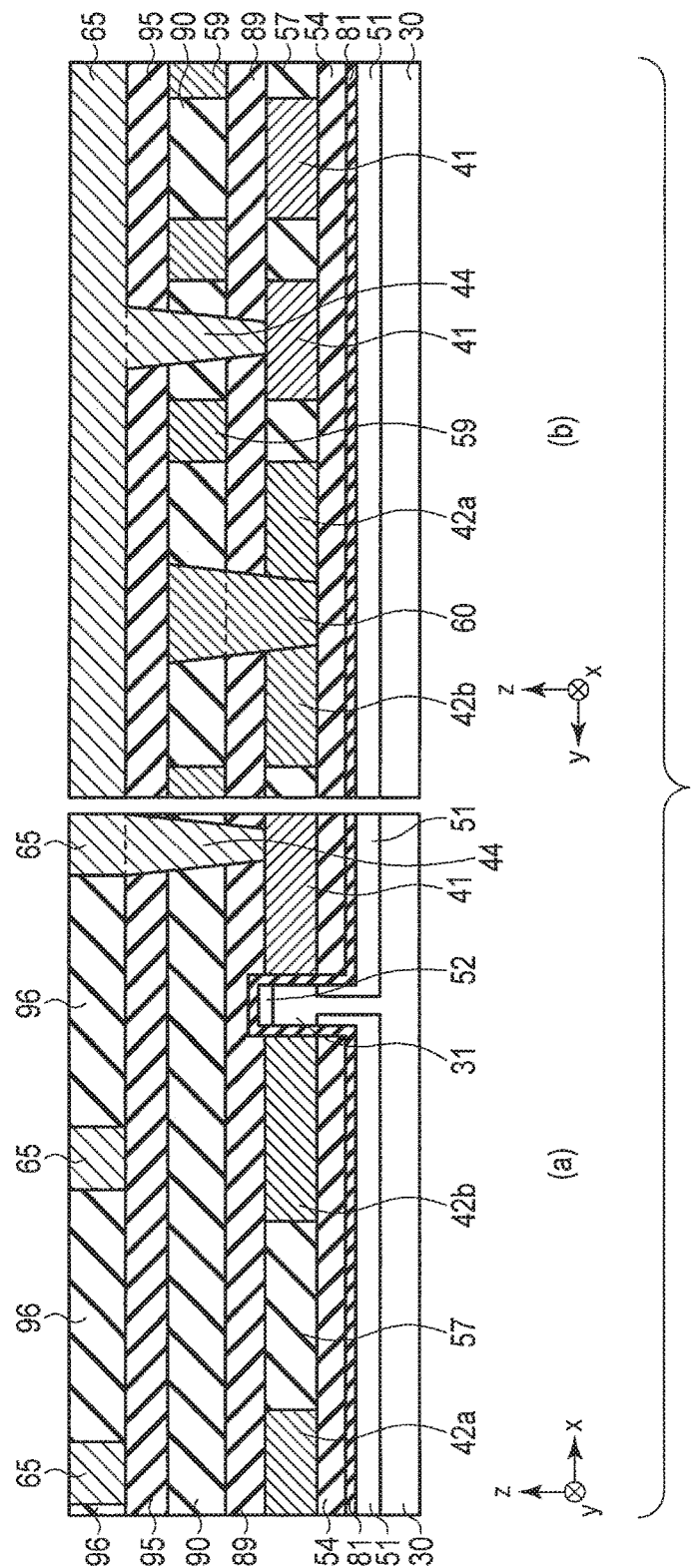
FIG. 27 shows a cross-sectional structure of the magnetoresistive memory device during the manufacturing process subsequent to FIG. 26 according to the embodiment.

As shown in FIG. 27, conductors are formed in. the trenches 97 and the holes 98, and thereby the y word lines 65 and the plugs 44 are formed. The y word lines 65 and the plugs 44 may be formed by single damascene processes.

Next, the insulator 70 is formed, as shown in FIG. 11. Holes for electrodes 43 are then formed in areas in which the electrodes 43 are to be formed by etching the insulators 70, 96, 95, 90 and 89. The holes are filled with conductors, and thereby electrodes 43 are formed.

A ferromagnet 211 is formed on a top of each of the electrodes 43, and a nonmagnet 212 is formed on tops of ferromagnets 211. An insulator is then formed on the entire top of the structure obtained by the process so far, and thereby an insulator 72 is formed in areas between the stacks of the ferromagnets 211 and the nonmagnets 212.

A ferromagnet 213 is then formed on the entire top the insulator 72, a conductor 214 is formed on the entire top of the ferromagnet 213, a ferromagnet 215 is formed on the entire top of the conductor 214, and a conductor 75 is formed on the entire top of the ferromagnet 215. As a result, the structure shown in FIG. 11 is obtained.

The embodiment produces advantages that will be described below. It is known that conductors coupled to both ends of each memory cell can be realized by linear conductors (referred to as bit lines BL and source lines SL). Such a structure that uses the bit lines BL and source lines SL prevents improvement in characteristics, as miniaturization is advanced for higher integration. That is, if the bit lines BL and source lines SL are reduced in dimensions with their aspect ratios maintained, the resistance values of the bit lines BL and the source lines SL increase. To avoid that, if the bit lines BL and source lines SL having high aspect ratios are reduced in dimensions, an increase in resistance values of the bit lines BL and source lines SL are suppressed, but their capacitances increase. Thus, RC products of the bit lines BL and source lines SL are increased by miniaturization using either of the techniques. A circuit having a high RC product cannot be operated at high speed.

Figure 28:
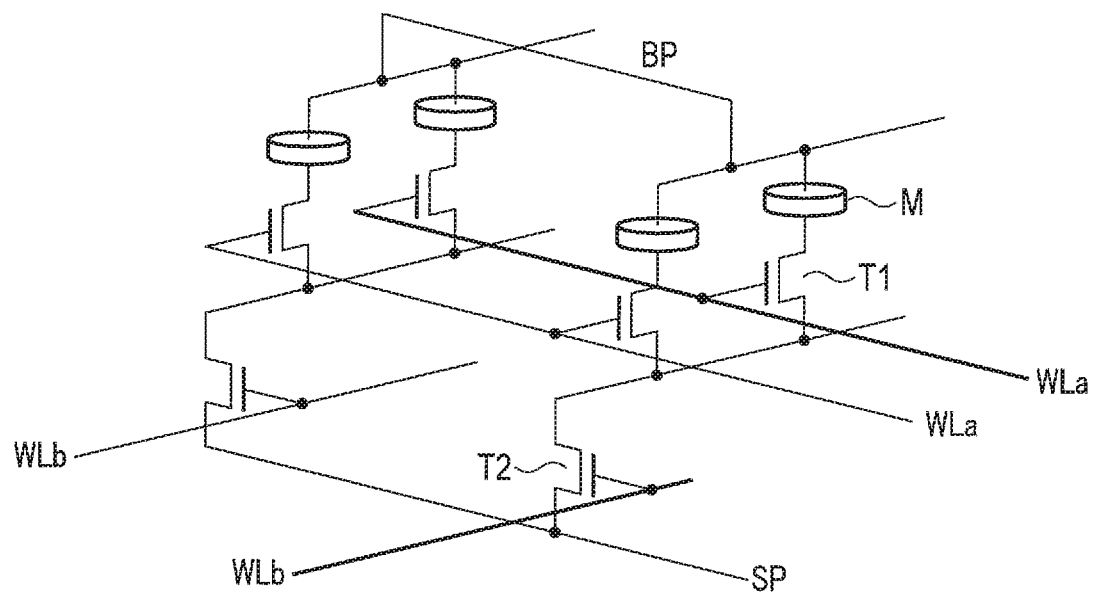
FIG. 28 is a circuit diagram showing part of another magnetoresistive memory device for reference.

In contrast, there is a structure that realizes conductors coupled to both ends of each memory cell using plate-shaped conductors (a bit plate BP and a source plate SP). Such a structure suppresses an increase in an RC product resulting from miniaturization of memory cells. In such a structure, because transistors T that share a word line WL are coupled to the bit plate BP through their respective MTJ elements for improvement in integration degree, enabling selection of one MTJ element from multiple MTJ elements M requires each of the MTJ elements M to be coupled to the bit plate BP and the source plate SL via transistors T1 and T2 coupled in series, as shown in FIG. 28. Thereby, when one transistor T1 and one transistor T2 are selected through selection of the word lines WLa and WLb, a current path that runs only through one MTJ element M is formed between the bit plate BP and the source plate SP. However, the current path that runs between the bit plate BP and the source plate SP through one MTJ element M includes two transistors T1 and T2, and has a high resistance.

In the structure shown in FIG. 28, two transistors T1 and T2 arranged need to be provided above the substrate in a direction away from the substrate. Since these transistors cannot be formed on the substrate, a semiconductor layer for the transistors needs to be formed separately from the substrate, and such a semiconductor layer must be a polycrystalline semiconductor layer. This results in a low operation speed of the transistors.

According to the embodiment, each memory cell 12 is coupled to the hit plate 11 and the source plate 13, and includes an MTJ element 21 and a double-gate transistor 22. The use of the bit plate 11 and the source plate 13 can realize a magnetoresistive memory device 1 including conductors with a small RC product, even in small dimensions.

Besides, between the bit plate 11 and the source plate 13, only a memory cell 12 including a transistor 22 that is turned on is selected. Accordingly, only one MTJ element 21 can be coupled between the bit plate 11 and the source plate 13.

The current path that runs between the bit plate 11 and the source plate 13 and includes the selected memory cell 12 does not include multiple transistors coupled in series. Accordingly, the resistance of the current path is lower than that of the structure shown in FIG. 28.

In addition, the transistors 22 can be formed on the substrate 30. This enables formation of the transistors 22 on a monocrystalline semiconductor and a high-speed operation of the transistors 22, thus enabling a high-speed operation of the magnetoresistive memory device 1.

The circuit configuration shown in FIG. 3 according to the embodiment may be realized by a structure different from the structure shown in FIGS. 9-11, such as a structure which includes interconnects which obliquely extend with respect to the x and y axes as viewed in the xy plane, or a structure that is more complex than the structure shown in FIGS. 9-11. However, a complex manufacturing process is required to achieve such structures. In contrast, the structure according to the embodiment may be realized by a combination of conductors extending along the x axis or y axis, which is often used in a manufacturing process of a semiconductor device, and is also used in manufacturing a magnetoresistive memory device. This enables the magnetoresistive memory device 1 to be manufactured through a simple manufacturing process.

A magnetoresistive memory device that stores data using MTJ elements as resistance change elements have been described as an example, but the embodiment is not limited thereto. The embodiment may be applicable to resistance-change-type memories using resistance change elements that store data using resistance change in a manner similar to MRAMs, such as resistive RAMS (ReRAMs) and phase change RAMS (PCRAMs). In addition, the embodiments may be applicable to a memory device including an element that can store data by a resistance change caused by application of a current or voltage, or can read data stored by converting a resistance difference caused by the resistance change into a current difference or a voltage difference, regardless of whether the memory device is a volatile memory or a nonvolatile memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device, comprising:
   first a resistance change element including a first terminal and a second terminal and having one of two different switchable resistances;
   a second resistance change element including a third terminal coupled to the first terminal of the first resistance change element, including a fourth terminal, and having one of two different switchable resistances;
   a first double-gate transistor including a fifth terminal coupled to the second terminal of the first resistance change element, including a sixth terminal, and including a first gate coupled to a first word line and a second gate coupled to a second word line independent from the first word line; and
   a second double-gate transistor including a seventh terminal coupled to the fourth terminal of the second resistance change element, including an eighth element, and including a third gate coupled to the first word line and a fourth gate coupled to a third word line independent from the first and second word lines.

2. The memory device according to claim 1, further comprising:
   a third resistance change element including a ninth terminal coupled to the first terminal of the first resistance change element, including a tenth terminal, and having one of two different switchable resistances; and
   a third double-gate transistor including an eleventh terminal coupled to the tenth terminal of the third resistance change element, including a twelfth terminal, and including a fifth gate coupled to a fourth word line independent from the first to third word lines and a sixth gate coupled to the second word line.

\* \* \* \* \*